United States Patent
Kim et al.

(10) Patent No.: US 11,301,331 B2
(45) Date of Patent: Apr. 12, 2022

(54) STORAGE DEVICE AND OPERATING METHOD OF STORAGE DEVICE

(71) Applicant: Samsung Electronics Co., Ltd., Suwon-si (KR)

(72) Inventors: Seokhwan Kim, Seoul (KR); Yonggil Song, Hwaseong-si (KR); Chui Lee, Hwaseong-si (KR); Jooyoung Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 57 days.

(21) Appl. No.: 16/529,320

(22) Filed: Aug. 1, 2019

(65) Prior Publication Data

US 2020/0097367 A1    Mar. 26, 2020

(30) Foreign Application Priority Data

Sep. 20, 2018  (KR) .................. 10-2018-0113169
Apr. 1, 2019   (KR) .................. 10-2019-0038028

(51) Int. Cl.
  *G06F 11/14*   (2006.01)
  *G06F 3/06*    (2006.01)
  *G11C 14/00*   (2006.01)

(52) U.S. Cl.
  CPC ........ *G06F 11/1451* (2013.01); *G06F 3/0619* (2013.01); *G06F 3/0659* (2013.01); *G06F 3/0679* (2013.01); *G11C 14/0009* (2013.01)

(58) Field of Classification Search
  CPC .. G06F 11/1451; G06F 3/0619; G06F 3/0659; G06F 3/0679; G11C 14/0009
  See application file for complete search history.

(56) References Cited

U.S. PATENT DOCUMENTS 7,433,898 B1 * 10/2008 Georgiev .............. G06F 11/203
7,613,750 B2   11/2009 Valiyaparambil et al.
9,311,333 B1    4/2016 Pawar et al.
9,460,177 B1   10/2016 Pawar et al.
(Continued)

FOREIGN PATENT DOCUMENTS

KR      100501414 B1    7/2005
KR      20160004486 A   1/2016
WO      WO-2015/020811 A1   2/2015

OTHER PUBLICATIONS

"NVME-101-1, Part 1: NVMe™: What you need to know for next year." NVM Express® organization. Speakers Jenene Ellefson, David Allen, J. Metz. Flash Memory Summit, Aug. 2018.
(Continued)

*Primary Examiner* — Eric Cardwell
(74) *Attorney, Agent, or Firm* — Harness, Dickey & Pierce, P.L.C.

(57) ABSTRACT

A storage device includes a nonvolatile memory device, a random access memory that includes a first region and a second region, and a controller that is configured to use the first region of the random access memory as a journal memory for a journal indicating modification of data of the second region, expose a user region of the nonvolatile memory device to an external host device as a first access region of a block unit, and expose the second region of the random access memory to the external host device as both a second access region of the block unit and a third access region of a byte unit.

5 Claims, 18 Drawing Sheets

(56) References Cited

U.S. PATENT DOCUMENTS

| | | |
|---|---|---|
| 9,864,774 B2 | 1/2018 | Marcotte |
| 2015/0379036 A1 | 12/2015 | Shin et al. |
| 2016/0170842 A1 | 6/2016 | Mendez |
| 2016/0291887 A1 | 10/2016 | Gole et al. |
| 2016/0342487 A1* | 11/2016 | Ware ................ G06F 3/0619 |
| 2017/0192679 A1 | 7/2017 | Le et al. |
| 2017/0230180 A1* | 8/2017 | Benedict ............ H04L 63/04 |
| 2018/0018171 A1* | 1/2018 | Amidi ................ G06F 12/06 |
| 2018/0260136 A1 | 9/2018 | Huo et al. |

OTHER PUBLICATIONS

Chandler Chadha, "NVMe SSD with Persistent Memory Region" Flash Memory Summit, Aug. 2017.

* cited by examiner

STORAGE DEVICE AND OPERATING METHOD OF STORAGE DEVICE

CROSS-REFERENCE TO RELATED APPLICATIONS

This application claims priority under 35 U.S.C. § 119 to Korean Patent Application Nos. 10-2018-0113169 filed on Sep. 20, 2018, and 10-2019-0038028 filed on Apr. 1, 2019, in the Korean Intellectual Property Office, the disclosures of which are incorporated by reference herein in their entireties.

BACKGROUND

Some example embodiments of some inventive concepts described herein relate to semiconductor devices, and more particularly, relate to storage devices permitting a block unit access and a memory mapped access to a portion of a storage region and operating methods of such storage devices.

An operating system or an application may use a main memory and auxiliary storage. The main memory may be used to store data temporarily, and the auxiliary storage may be used to store data without information loss in a persistent manner. The operating system may manage the auxiliary storage based on a file system. The file system may include various descriptive information about files, such as an address of a memory location where data of each file is stored and the sizes of the files.

The file system may be updated when the operating system or the application modifies or updates data (hereinafter referred to as "user data") stored in the auxiliary storage. Updating the file system for individual modifications or updates of the user data may cause an increase in the number of accesses to the auxiliary storage, which may increase latency of the auxiliary storage and/or reduce the lifespan of the auxiliary storage device.

Another operating system may store user data and descriptive features of the file system (hereinafter referred to as "metadata") that may be associated with the user data in the main memory. The operating system may perform a commit to synchronize user data and a file system that the operating system drives and user data and a file system stored in the auxiliary storage. The commit includes a process in which the operating system writes user data in a user region of the auxiliary storage and writes metadata in a journal region of the auxiliary storage. Once the commit is performed, in the event of sudden power-off (SPO), the operating system may be able to recover user data and a file system based on the journal region.

The operating system may apply the data and the metadata of the journal region to the user region at events such as power-on and/or power-off, or at a separate time. For example, the operating system may copy or move the user data of the journal region to the user region. Also, the operating system may apply the metadata of the journal region to data of the file system stored in the user region.

As described above, the commit accompanies operations of writing user data and metadata in the auxiliary storage. If the commit is performed for each instance of writing user data and/or metadata in the auxiliary storage, these operations may increase a time to perform the commit, may increase a latency of the auxiliary storage, and/or may decrease a lifespan of the storage device.

SUMMARY

According to some example embodiments, a storage device may include a nonvolatile memory device, a random access memory that includes a first region and a second region, and a controller that is configured to use the first region of the random access memory as a journal memory for a journal indicating modification of data of the second region, expose a user region of the nonvolatile memory device to an external host device as a first access region of a block unit, and expose the second region of the random access memory to the external host device as both a second access region of the block unit and a third access region of a byte unit.

According to some example embodiments, a storage device may include a nonvolatile memory device, a dynamic random access memory that includes a first region and a second region, and a controller that is configured to use the first region as a journal memory for a journal indicating modification of data of the second region, expose a user region of the nonvolatile memory device to an external host device as a first access region of a block unit. The second region includes segments. The controller selects a first segment of the segments, selects at least two second segments from the remaining segments of the segments other than the first segment, and provides nonvolatility to the selected segments. The at least two second segments are dynamically changed in a ring buffer manner within the remaining segments.

According to some example embodiments, a method of operating a storage device may include a controller, a nonvolatile memory device, and a dynamic random access memory, wherein the method includes providing, by the controller, a portion of a storage space of the nonvolatile memory device to an external host device as a user region, and providing, by the controller, a portion of a storage space of the dynamic random access memory to the external host device as a journal region, a write operation of a byte unit and a read operation of a block unit being permitted. A storage space of the journal region includes segments, and the providing of the portion of the storage space of the dynamic random access memory includes providing, by the controller, nonvolatility to a first segment and at least two second segments from among the segments, the first segment being fixed and the at least two second segments being dynamically changed.

According to some example embodiments, a storage device may include a nonvolatile memory device; a random access memory including a first region and a second region; and a controller configured to expose the second region to the external host device for user data that is accessible as a block unit, store, in the first region, a journal indicating modification of data of the second region, wherein the journal indicates sub-blocks of the block unit that are to be committed to the nonvolatile memory device, and flush the second region to the nonvolatile memory storage by committing the sub-blocks of the block unit indicated by the journal.

BRIEF DESCRIPTION OF THE FIGURES

The above and other objects and features of some example embodiments of some inventive concepts will become apparent by describing in detail exemplary embodiments thereof with reference to the accompanying drawings.

DETAILED DESCRIPTION

Below, some example embodiments of some inventive concepts are described in detail and to such an extent that an ordinary one in the art may implement some inventive concepts.

Figure 1:
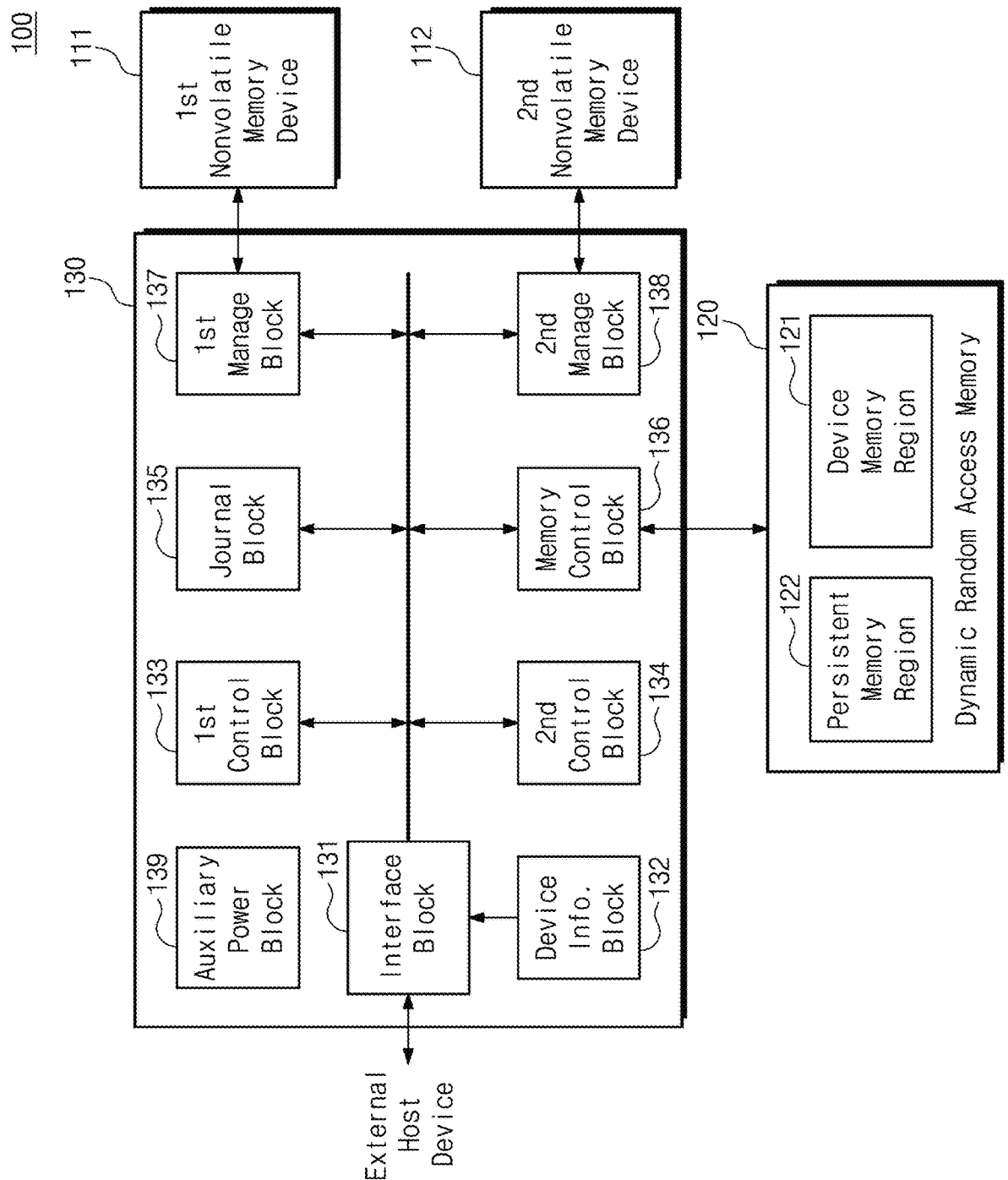
FIG. 1 illustrates a storage device according to an example embodiment of some inventive concepts.

FIG. 1 illustrates a storage device 100 according to some example embodiments of some inventive concepts. Referring to FIG. 1, the storage device 100 includes first and second nonvolatile memory devices 111 and 112, a dynamic random access memory 120, and a controller 130. The storage device 100 may include a solid state drive (SSD). The first and second nonvolatile memory devices 111 and 112 may perform a write operation, a read operation, and/or an erase operation under control of the controller 130. The first and second nonvolatile memory devices 111 and 112 may communicate with the controller 130 through different channels and may operate independently of each other.

In some example embodiments including as shown in FIG. 1, a controller 130 may be configured to expose a portion of a storage space of the first and second nonvolatile memory devices 111 and 112 to an external host device. The first and second nonvolatile memory devices 111 and 112 may include various nonvolatile memory devices such as a flash memory device, a phase change memory device, a magnetic memory device, a resistive memory device, and/or a ferroelectric memory device.

In some example embodiments including as shown in FIG. 1, a dynamic random access memory 120 may be configured to perform a write operation and/or a read operation under control of the controller 130. A storage space of the dynamic random access memory 120 may be partitioned into a device memory region 121 and a persistent memory region 122 by the controller 130. As an example, the persistent memory region 122 may include volatile memory, such as dynamic random-access memory (DRAM) where data is first stored, and that is associated with nonvolatile storage, to which the data is backed up, for example, on a periodic basis. After a power cycle event, the contents of the main memory may be restored from the nonvolatile storage, thereby enabling the data stored by the main memory to be persistent (e.g., not lost due to a loss of power) even though the main memory in which the data is first stored may be volatile.

In some example embodiments, a controller 130 may be configured to expose the persistent memory region 122 to the external host device. For example, the controller 130 may be configured to expose the persistent memory region 122 to the external host device as a memory mapped region. In some example embodiments, a persistent memory region 122 may be exposed to the external host device as a region in which a block-based access is allowed. The device memory region 121 may not be exposed to the external host device and may be accessed by the controller 130. The device memory region 121 may be used to store management data (or metadata) and/or code that may be involved in managing the storage device 100. The device memory region 121 may be used as a journal memory and/or a cache memory.

In some example embodiments discussed herein, storage regions of the dynamic random access memory 120 may be described with specific names of the device memory region 121 and the persistent memory region 122. However, the names used herein for the device memory region 121 and the persistent memory region 122 are for clarity of description, and it is to be appreciated that functions and characteristics of the device memory region 121 and the persistent memory region 122 are not limited by the names.

In some example embodiments, a controller 130 may be configured to control the first and/or second nonvolatile memory devices 111 and 112 and/or the dynamic random access memory 120. The controller 130 may communicate with the external host device. The controller 130 may include an interface block 131, a device information block 132, a first control block 133, a second control block 134, a journal block 135, a memory control block 136, a first manage block 137, a second manage block 138, and an auxiliary power block 139. Some example embodiments may include a controller 130 that includes hardware such as logic circuits; a hardware/software combination, such as a processor executing software; or a combination thereof. For example, a processor may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In some example embodiments, the interface block 131, the first control block 133, the second control block 134, the journal block 135, the memory control block 136, the first manage block 137, and/or the second manage block 138 may communicate with each other through an internal bus, and/or the interface block 131 may communicate with the external host device. In other example embodiments, some or all of the identified elements may communicate directly, such as via a trace or wire directly coupling the elements, and/or more indirectly, for example, through a third element.

In some example embodiments, based on power being supplied to the storage device 100 (for example, by an external host device), an interface block 131 may be configured to receive device information of the storage device 100 from the device information block 132 and/or to provide the device information of the storage device 100 to the external host device. For example, the device information of the storage device 100 may include information about a portion of the first nonvolatile memory device 111, and/or the second nonvolatile memory device 112 and/or the persistent memory region 122. The interface block 131 may be configured to receive and/or send the device information of the storage device 100, for example to or from the external host device, as a portion of an initialization operation.

In some example embodiments, normal operations may be performed in a normal mode based on completion of an initialization operation. For example, the interface block 131 may be configured to receive a request from the external host device and/or to parse a received request. For example, the interface block 131 may be configured to permit a block-based request and/or a memory mapped request of the external host device. The block-based request may include a logical block address LBA. The block-based request may be configured to indicate a position in which data is to be written and/or a position in which data is to be read based on the logical block address LBA. A memory mapped request may include a virtual address VA of a byte unit. The memory mapped request may indicate a position in which data is to be written and/or a position in which data is to be read based on the virtual address VA. The interface block 131 may be configured to provide the block-based request to the first control block 133 and/or to provide the memory mapped request to the second control block 134.

In some example embodiments, an interface block 131 may be based on a peripheral component interconnect express (PCIe) and a nonvolatile memory express (NVMe). The interface block 131 may be configured to receive a memory mapped request from a memory mapped input/output (I/O) of the PCIe or NVMe and/or a block-based request in a block I/O mode of the PCIe or NVMe. The interface block 131 may be configured to provide data received from the external host device to the device memory region 121 through the memory control block 136 and/or to output data provided from the device memory region 121 to the external host device.

In some example embodiments, a device information block 132 may be configured to provide device information of the storage device 100 to the interface block 131, for example, in an initialization operation. The device information block 132 may include various nonvolatile memory devices such as an EEPROM, a flash memory device, a phase-change memory device, a magnetic memory device, a ferroelectric memory device, and a resistive memory device.

In some example embodiments, a first control block 133 may be configured to receive the block-based request from the interface block 131. The first control block 133 may be configured to determine whether the block-based request is of a first type or a second type. For example, based on the logical block address LBA included in the block-based request indicating at least one of the first and second nonvolatile memory devices 111 and 112, the block-based request may be determined to be of the first type. As another example, based on the logical block address LBA included in the block-based request indicating the persistent memory region 122, it may be determined that the block-based request is of the second type. Based on the block-based request corresponding to the first type, the first control block 133 may be configured to refer to a first mapping table. Based on the block-based request corresponds to the second type, the first control block 133 may be configured to refer to a second mapping table. The first mapping table may include mapping information between physical block addresses PBA of the first and/or second nonvolatile memory devices 111 and 112 and/or logical block addresses LBA. The second mapping table may include mapping information between physical addresses PA of the persistent memory region 122 and/or the logical block addresses LBA. The first mapping table and/or the second mapping table may be stored in the device memory region 121 of the dynamic random access memory 120. The first control block 133 may be configured to translate a logical block address LBA of the block-based request of the first type to a physical block address PBA based on the first mapping table. The first control block 133 may be configured to provide the translated physical block address PBA to the first manage block 137 and/or the second manage block 138 together with a write command and/or a read command.

In some example embodiments, a first control block 133 may be configured to translate a logical block address LBA of the block-based request of the second type to a physical address PA of the persistent memory region 122 based on the second mapping table. The first control block 133 may be configured to access the persistent memory region 122 through the memory control block 136 based on the translated physical address PA. The first control block 133 may be configured to perform direct memory access (DMA) control such that data provided from the external host device through the interface block 131 is written in the device memory region 121 and/or such that data stored in the device memory region 121 is output to the external host device through the interface block 131.

In some example embodiments, based on a sudden power-off (SPO) event such as an interruption of power from an external host device, a storage device 100 may receive auxiliary power from an auxiliary power source that is configured to supply power to the storage device 100, such as an auxiliary power block 139. While auxiliary power is supplied by an auxiliary power source, the first control block 133 may be configured to back up data in at least a portion of the persistent memory region 122 to at least one of the first and second nonvolatile memory devices 111 and 112. The first control block 133 may further be configured to perform a backup of data targeted for backup, including metadata such as a mapping table, and/or data stored in the device memory region 121, to free storage space of at least one of the first and second nonvolatile memory devices 111 and 112. Based on a restoration of power from an external host device, the first control block 133 may be configured to load the backed-up data to the persistent memory region 122 and/or to load backed-up data corresponding to the device memory region 121 from the device memory region 121. The first control block 133 may be configured to provide nonvolatility to the persistent memory region 122, for example, by performing backup and/or load operations based on the auxiliary power block 139. The second control block 134 may be configured to receive the memory mapped request from the interface block 131. The second control block 134 may refer to a third mapping table, which may include mapping information between virtual addresses VA of the memory mapped request and/or physical addresses PA of the persistent memory region 122. The third mapping table may be stored in the device memory region 121 and/or the persistent memory region 122 of the dynamic random access memory 120. The second control block 134 may be configured to translate a virtual address VA of the memory mapped request to a physical address PA, for example based on the third mapping table, and/or to access the persistent memory region 122 through the memory control block 136 based on the translated physical address PA.

In some example embodiments, a journal block 135 may be configured to store code and/or instructions to be executed by the first control block 133 and/or the second control block 134. The journal block 135 may be configured to store data to be used by the first control block 133 and/or the second control block 134, such as metadata.

In some example embodiments, a memory control block 136 may be configured to control the dynamic random access memory 120. The memory control block 136 may be configured to provide a command and/or an address to the dynamic random access memory 120, for example, depending on a command system and/or an address system of the dynamic random access memory 120. The memory control block 136 may be configured to exchange data with the dynamic random access memory 120, based on a data communication system of the dynamic random access memory 120.

In some example embodiments, a first manage block 137 may be configured to control the first nonvolatile memory device 111 and/or a second manage block 138 may be configured to control the second nonvolatile memory device 112. The first and/or second manage blocks 137 and 138 may be configured to provide a command and/or an address to the first and second nonvolatile memory devices 111 and 112, for example, depending on a command system and/or an address system of the first and/or second nonvolatile memory devices 111 and 112. The first and/or second manage blocks 137 and 138 may exchange data with the first and/or second nonvolatile memory devices 111 and 112, for example, depending on a data communication system of the first and second nonvolatile memory devices 111 and 112.

In some example embodiments, an auxiliary power block 139 may be configured to power the storage device 100 based on a sudden power-off SPO event. The auxiliary power block 139 may be charged when a power is normally supplied from the external host device, such as based on a restoration of power from the external host device. The auxiliary power block 139 may include a tantalum capacitor or a super capacitor. An example embodiment is illustrated as the auxiliary power block 139 is positioned within the controller 130, but in other example embodiments, the auxiliary power block 139 may be positioned outside the controller 130.

Figure 2:
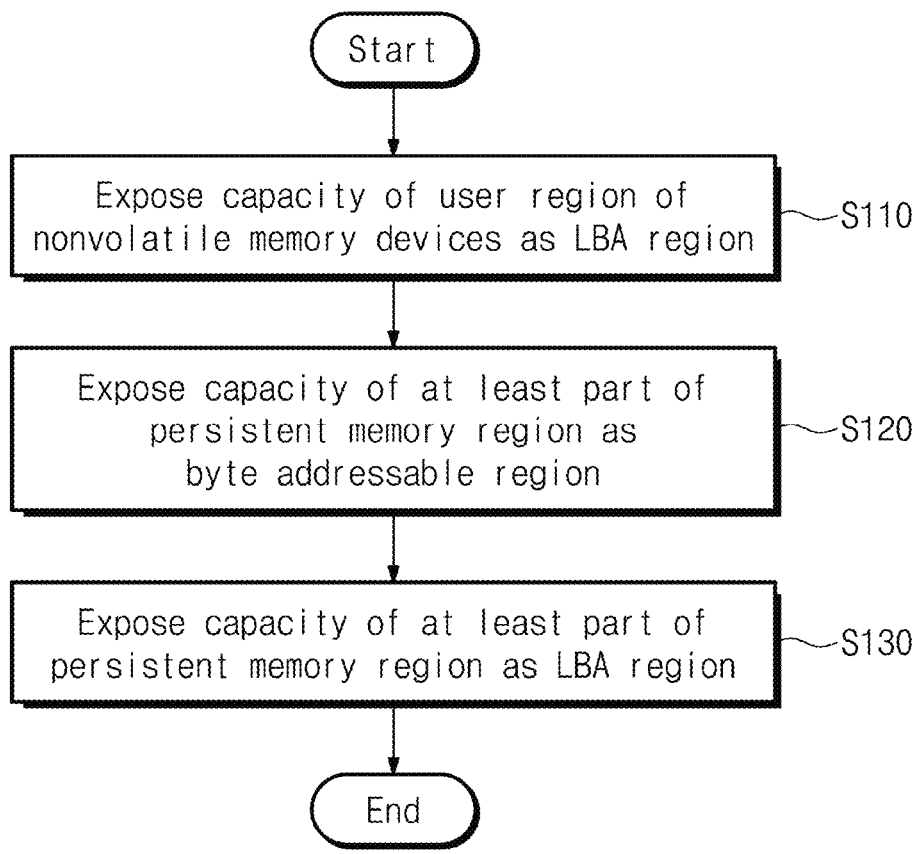
FIG. 2 illustrates an example in which a storage device provides device information to an external host device in an initialization operation.

FIG. 2 illustrates an example embodiment in which a device, such as storage device 100 of FIG. 1, may provide device information to an external host device in an initialization operation. Referring to the example embodiments of FIG. 2, in operation S110, the controller 130 exposes a capacity of a user region of the first and second nonvolatile memory devices 111 and 112 to the external host device as a logical block address (LBA) region. For example, the LBA region may indicate a region that the external host device is able to access based on a logical block address LBA. The external host device may be configured to assign logical block addresses LBA to the capacity exposed in operation S110. The external host device may be configured to identify the capacity exposed in operation S110 based on a logical block address LBA.

In operation S120, the controller 130 exposes a capacity of at least a portion of the persistent memory region 122 to the external host device as a byte addressable region. For example, the byte addressable region may be a region that may be included in a memory map by the external host device. The external host device may be configured to assign virtual addresses VA to the capacity exposed in operation S120. The external host device may be configured to identify the capacity exposed in operation S120 based on the virtual address VA.

In operation S130, the controller 130 exposes a capacity of at least a portion of the persistent memory region 122 to the external host device as an LBA region. For example, the external host device may be configured to assign logical block addresses LBA to the capacity exposed in operation S130. The external host device may be configured to identify the capacity exposed in operation S130 based on a logical block address LBA.

In some example embodiments, the capacity of the persistent memory region 122 exposed in operation S120 and operation S130 may be accessed as a ring-fenced region. For example, the persistent memory region 122 may be configured to be reserved for and/or used as a journal region by an operating system of the external host device.

In some example embodiments, with regard to the persistent memory region 122, the controller 130 may be configured to support a block-based read operation of the external host device and/or to support a memory mapped write operation of the external host device. With regard to the persistent memory region 122, the controller 130 may be configured to prohibit a block-based write operation of the external host device and/or to prohibit a memory mapped read operation of the external host device.

In some example embodiments, the controller 130 may be configured to perform a physical address (PA) based access on the device memory region 121 and/or the persistent memory region 122 of the dynamic random access memory 120. That is, independently of allowing the block-based read operation and/or the memory mapped write operation of the external host device, the controller 130 may be configured to freely access the device memory region 121 and the persistent memory region 122.

Figure 3:
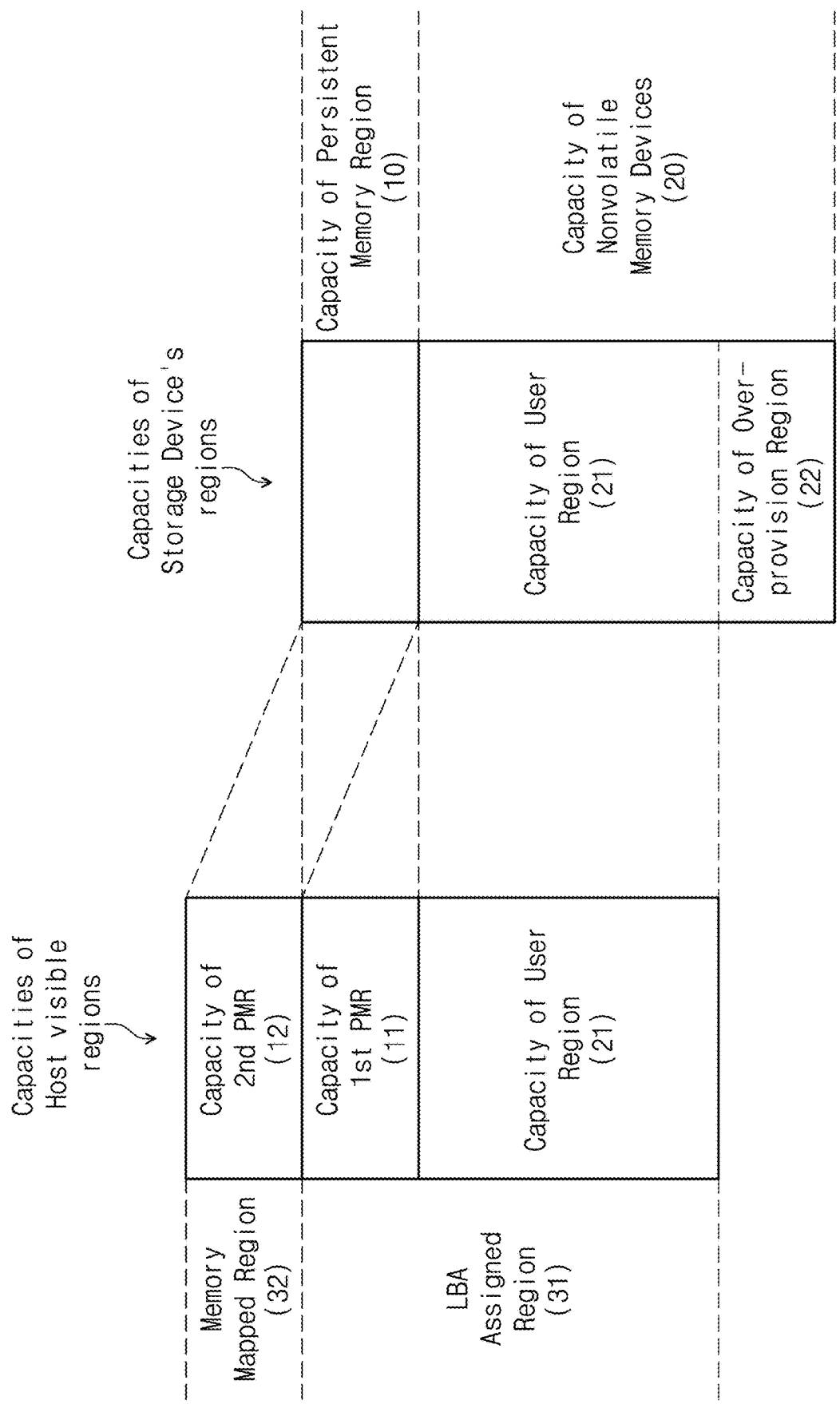
FIG. 3 illustrates capacities of physical storage regions of a storage device and capacities of regions visible by an external host device.

FIG. 3 illustrates an example of capacities of physical storage regions of the storage device 100 and capacities of regions that may be visible to an external host device. Referring to FIGS. 1 and 3, the controller 130 may be configured to expose, to the external host device, a capacity 21 of a user region except for a capacity 22 of an over-provision region from among a capacity 20 of the nonvolatile memory devices 111 and 112. The capacity 22 of an over-provision region may be used for various background operations of an external host device, a controller 130, and/or a storage device, such as a read reclaim operation, a wear leveling operation, and a garbage collection operation. The capacity 22 of the over-provision region may be used to write update data of data written in the capacity 21. The usage of the capacity 22 of the over-provision region may prevent or reduce latency of the storage device 100 and/or may promote a lifetime of the storage device 100, for example, due to erase-before-write characteristics of the storage device 100.

In some example embodiments, an external host device and/or a controller 130 may be configured to identify the capacity 21 of the user region as a portion of a to which a logical block address LBA is assigned. The external host device and/or controller 130 may be configured to assign logical block addresses LBA to the capacity 21 of the user region and/or to access the capacity 21 of the user region based on the logical block addresses LBA.

In some example embodiments, a controller 130 may be configured to expose a capacity 10 of the persistent memory region 122 to the external host device. For example, the controller 130 may be configured to expose the capacity 10 of the persistent memory region 122 to the external host device as a capacity for block-based access and/or memory mapped access. The external host device may be configured to identify the capacity 10 of the persistent memory region 122 in which block-based access is permitted as a capacity 11 of a first persistent memory region PMR being a portion of the region. The external host device may be configured to assign logical block addresses LBA to the capacity 11 of the first persistent memory region PMR and/or to access the capacity 11 of the first persistent memory region PMR based on the logical block addresses LBA. The external host device may be configured to identify the capacity 10 of the persistent memory region 122 in which a memory mapped access is permitted as a capacity 12 of a second persistent memory region PMR being a memory mapped region 32. The external host device may be configured to assign virtual addresses VA to the capacity 12 of the second persistent memory region PMR and/or to access the capacity 12 of the second persistent memory region PMR based on the virtual addresses VA.

In some example embodiments, the external host device may be configured to identify storage capacities of the storage device 100 as the region to which the logical block address LBA is assigned and the memory mapped region 32. When the external host device accesses the capacity 21 of the user region from among the capacity 31 to which the logical block address LBA is assigned, the storage device 100 may be configured to access the first nonvolatile memory device 111 and/or the second nonvolatile memory device 112 based on a request of the external host device. When the external host device accesses (e.g., reads) the capacity 11 of the first persistent memory region PMR from among the capacity 31 to which the logical block address LBA is assigned, the storage device 100 may be configured to access the persistent memory region 122 based on a request of the external host device. When the external host device accesses (e.g., writes) the capacity 12 of the second persistent memory region PMR from among the capacity 31 to which the logical block address LBA is assigned, the storage device 100 may be configured to access (e.g., write) the persistent memory region 122 based on a request of the external host device. The capacity 12 of the second persistent memory region PMR may be used as a journal region in which user data and modification data (e.g., metadata) of a file system are to be committed. The capacity 11 of the first persistent memory region PMR may be used as a journal region from which user data and metadata are read upon recovering a file system and/or upon applying information of the journal region to the file system.

Figure 4:
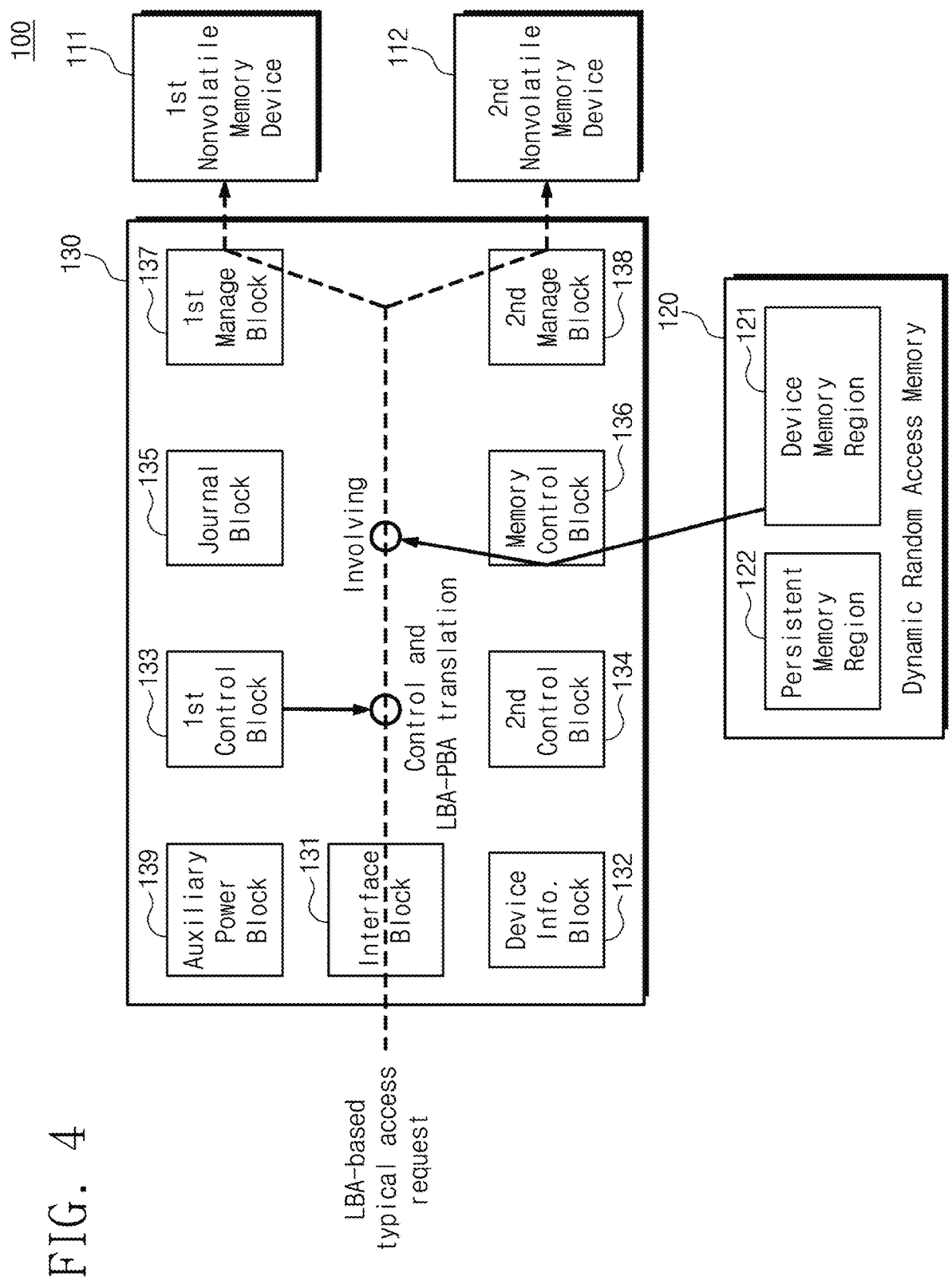
FIG. 4 illustrates an example embodiment including a normal access request that is processed in a storage device based on a logical block address.

FIG. 4 illustrates an example embodiment including a normal access request processed by the storage device 100 based on a logical block address LBA. For example, a normal access request may be a first type of access request including a logical block address LBA of the first and/or second nonvolatile memory devices 111 and 112. The interface block 131 may be configured to provide an access request to the first control block 133. The first control block 133 may be configured to control operations accompanied by the access request and/or to translate a logical block address LBA to a physical block address PBA based on the first mapping table. The first control block 133 may be configured to provide the access request to the first nonvolatile memory device 111 and/or the second nonvolatile memory device 112. The access request may be processed using the device memory region 121. For example, when the access request is a write request, user data received from the external host device may be written to a journal in the device memory region 121 and/or may be written in the first nonvolatile memory device 111 and/or the second nonvolatile memory device 112. When the access request is a read request, user data read from the first nonvolatile memory device 111 and/or the second nonvolatile memory device 112 may be buffered in the device memory region 121 and/or may be output to the external host device.

Figure 5:
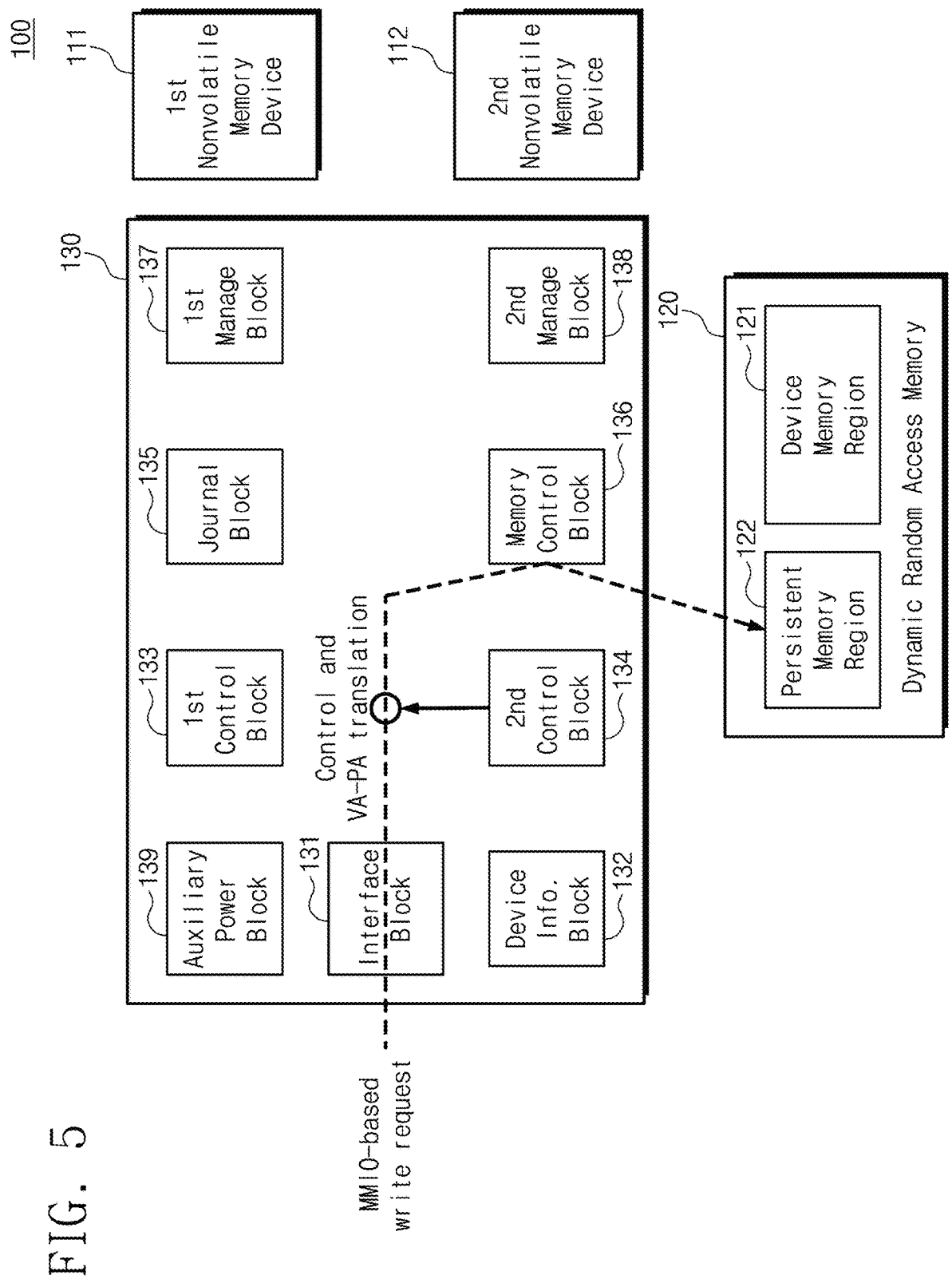
FIG. 5 illustrates an example embodiment including a memory mapped input/output that is processed in a storage device based on a write request.

FIG. 5 illustrates an example embodiment including a write request based on a memory mapped input/output (I/O) (MMIO) wherein the request is processed in the storage device 100. For example, an MMIO-based access request may include a write request for a journal region. Referring to FIG. 5, the interface block 131 may be configured to provide the MMIO-based access request to the second control block 134. The second control block 134 may be configured to control operations accompanied by the MMIO-based access request and/or to translate a virtual address VA to a physical address PA based on the third mapping table. The second control block 134 may be configured to write data, for example, metadata in the persistent memory region 122 through the memory control block 136 based on the physical address PA.

Figure 6:
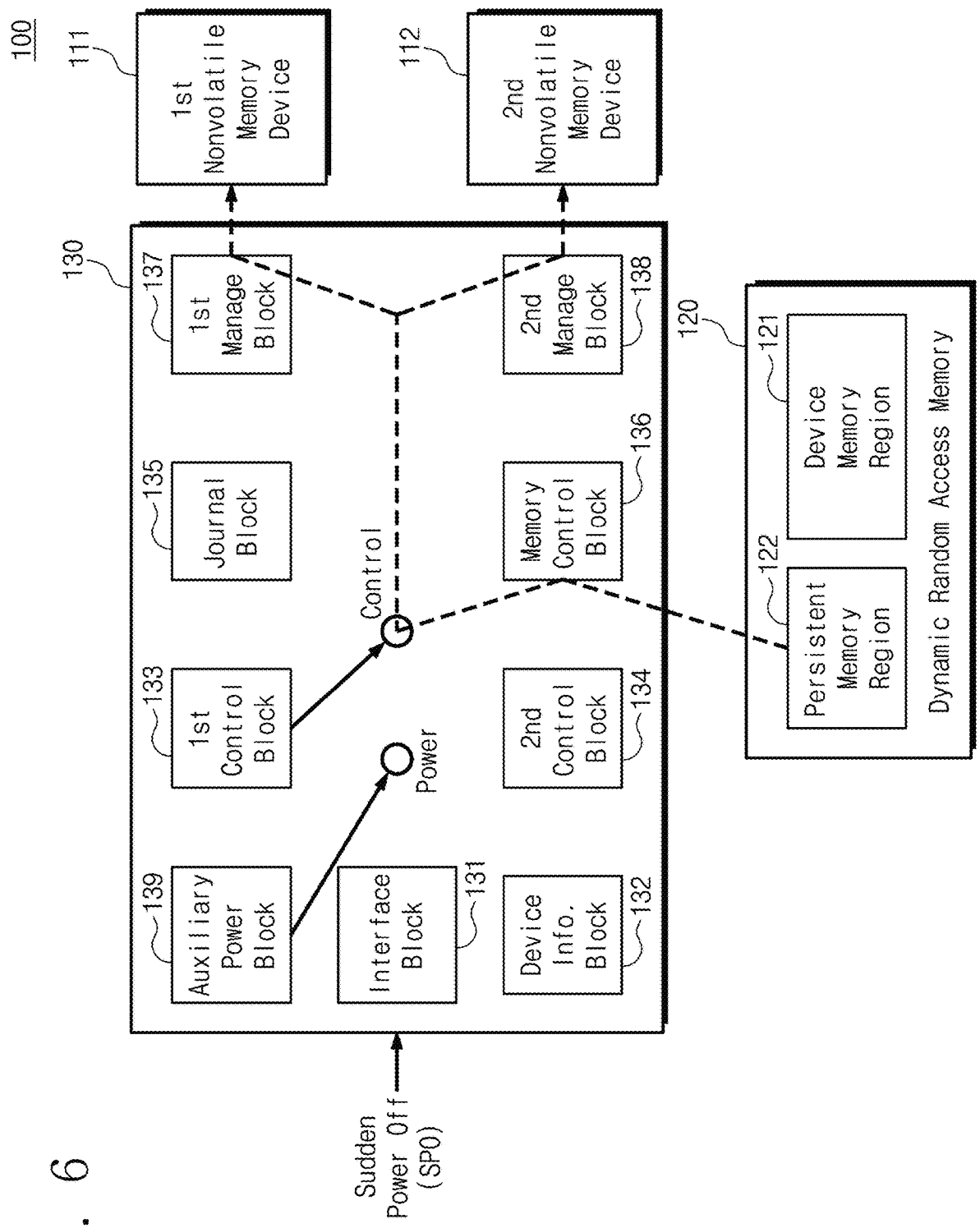
FIG. 6 illustrates an example embodiment including a storage device configured to back up data of a persistent memory region based on a sudden power-off event occurs.

FIG. 6 illustrates an example embodiment including the storage device 100 that backs up data of the persistent memory region 122 based on a sudden power-off SPO event. Referring to FIGS. 3 and 6, based on an interruption of power supplied from an external host device, the auxiliary power block 139 may be configured to power the storage device 100.

In some example embodiments, based on auxiliary power being supplied to the storage device 100, a first control block 133 may be configured to back up data stored in the persistent memory region 122 to the first nonvolatile memory device 111 and/or the second nonvolatile memory device 112. For example, the first control block 133 may be configured to store addresses of a specific range in the persistent memory region 122. Based on the auxiliary power being supplied, the first control block 133 may be configured to back up data stored at addresses of the specific range to the first nonvolatile memory device 111 and/or the second nonvolatile memory device 112. For example, the first control block 133 may be configured to back up addresses of data being stored in the persistent memory region 122, the second mapping table, and/or the third mapping table associated with the persistent memory region 122 to the first nonvolatile memory device 111 and/or the second nonvolatile memory device 112. The first control block 133 may be configured to back up data (e.g., metadata stored in the device memory region 121, such as a mapping table) including data stored in the device memory region 121, to the first nonvolatile memory device 111 and/or the second nonvolatile memory device 112.

In some example embodiments, data read from the persistent memory region 122 may be written in an empty storage capacity of the capacity 21 of the user region of the first nonvolatile memory device 111 and/or the second nonvolatile memory device 112 and/or in an empty storage capacity of the capacity 22 of the over-provision region of the first nonvolatile memory device 111 and/or the second nonvolatile memory device 112. Data read from the persistent memory region 122 may be written in a fixed space of the first nonvolatile memory device 111 and/or the second nonvolatile memory device 112. Space of the first nonvolatile memory device 111 or the second nonvolatile memory device 112 where data read from the persistent memory region 122 is stored may be selected in a variable manner.

Figure 7:
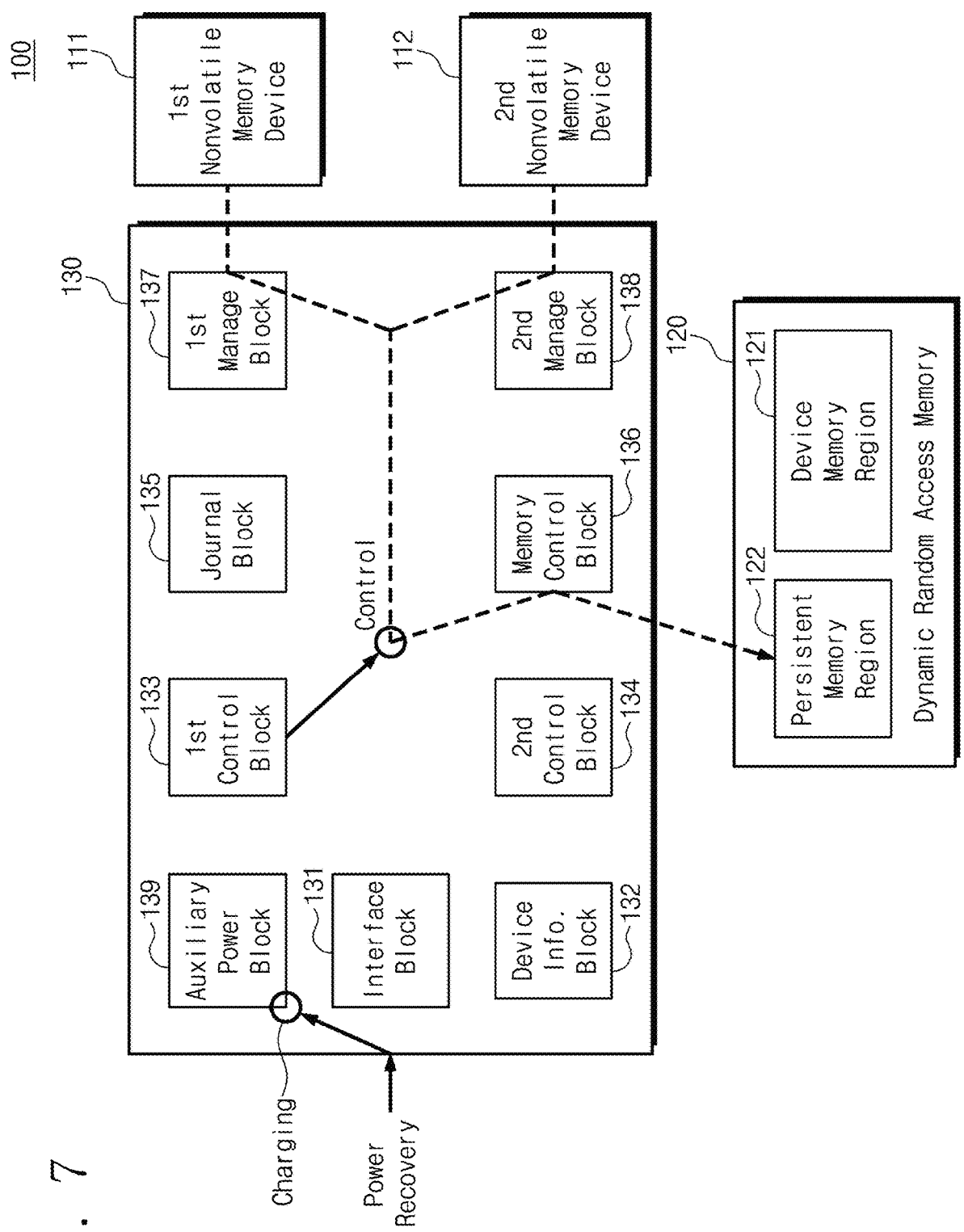
FIG. 7 illustrates an example embodiment including a storage device configured to load data onto a persistent memory region for recovery based on a restoration of power from an external host device.

FIG. 7 illustrates an example embodiment including a storage device 100 loading data into a persistent memory region 122 for recovery in a recovery mode based on a restoration of power from an external host device, such as following a sudden power off (SPO) event. Referring to FIG. 7, when based on power being supplied from the external host device, the first control block 133 may be configured to determine whether data targeted for recovery exists. For example, the first control block 133 may be configured to determine whether data targeted for recovery exists by identifying a flag or information that is added when data of the persistent memory region 122 is backed up. As another example, the first control block 133 may be configured to determine whether data targeted for recovery exists by checking valid data exists that is to be recovered from the first nonvolatile memory device 111 and/or the second nonvolatile memory device 112.

In some example embodiments, based on an existence of data for recovery, the first control block 133 may be configured to read the data targeted for recovery from the first nonvolatile memory device 111 and/or the second nonvolatile memory device 112 and/or to perform recovery by loading the read data onto the persistent memory region 122. The first control block 133 may be configured to read backed-up addresses from the first nonvolatile memory device 111 and/or the second nonvolatile memory device 112 and/or to load data onto the persistent memory region 122 based on the read addresses. The first control block 133 may be configured to perform recovery by reading the backed-up second mapping table and/or backed-up third mapping table from the first nonvolatile memory device 111 and/or the second nonvolatile memory device 112. The first control block 133 may be configured to load the read second and/or third mapping table onto the device memory region 121 and/or the persistent memory region 122. For example, the first control block 133 may be configured to perform recovery by reading, from the first nonvolatile memory device 111 and/or the second nonvolatile memory device, the data backed up from the device memory region 121, and/or loading the read data onto the device memory region 121.

Figure 8:
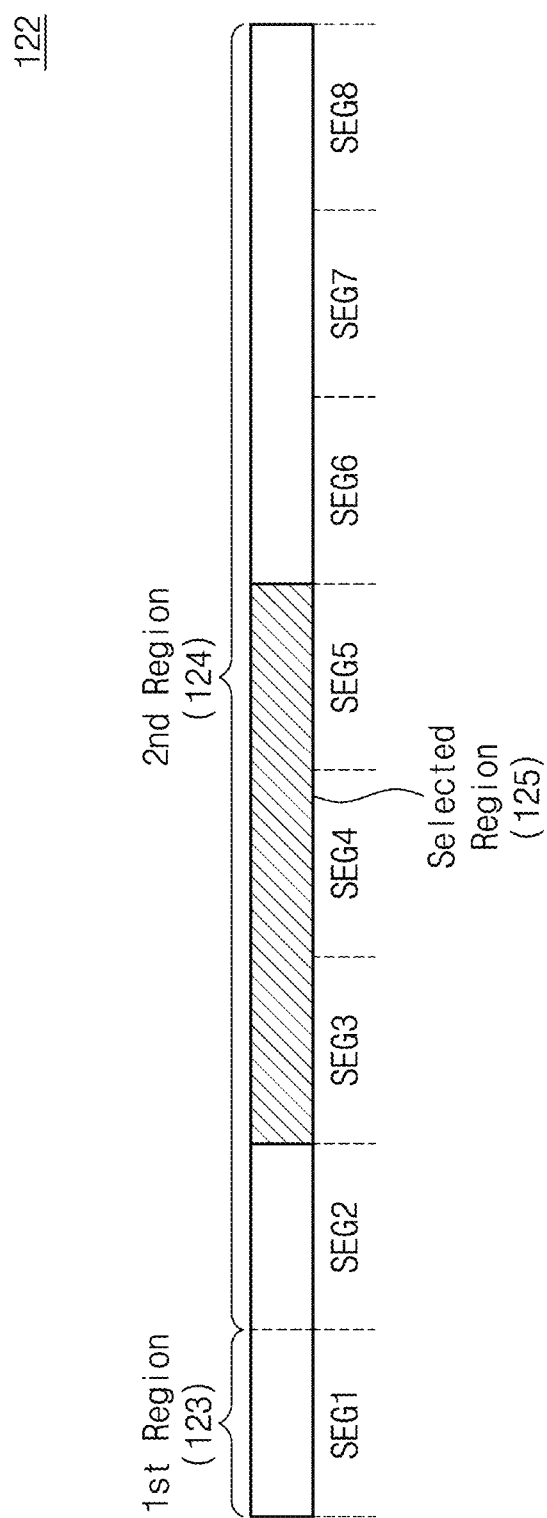
FIG. 8 illustrates an example embodiment including a controller configured to manage a persistent memory region.

FIG. 8 illustrates an example embodiment including a controller 130 that manages the persistent memory region 122. Referring to FIGS. 1 and 8, as an example, the controller 130 may be configured to partition the persistent memory region 122 into segments SEG1 to SEG8. The controller 130 may be configured to manage a segment, the position of which may be fixed, from among the first to eighth segments SEG1 to SEG8 as a first region. The controller 130 may be configured to manage the remaining segments SEG2 to SEG8 as a second region. Based on a sudden power-off SPO event, the controller 130 may be configured to back up data stored in the first segment SEG1 of a first region 123. For example, the first segment SEG1 may have the lowest physical address or the highest physical address of the persistent memory region 122. Also, the controller 130 may be configured to further back up data stored in the third to fifth segments SEG3 to SEG5 belonging to a selected region 125 from among the second to eighth segments SEG2 to SEG8 of a second region 124. For example, the controller 130 may be configured to store addresses of the third to fifth segments SEG3 to SEG5 of the selected region 125. When the sudden power-off SPO event occurs, the controller 130 may be configured to back up data of the third to fifth segments SEG3 to SEG5 of the selected region 125 based on the stored addresses.

In some example embodiments, the first segment SEG1 of the first region 123 may be configured to store a superblock of a journal region. The superblock may include information about the journal region, such as a position in which data is stored and a length of the stored data. A position in which a superblock is stored may be fixed, and the controller 130 may backup data of the fixed first region 123 in which the superblock is stored.

In some example embodiments, the second region 124 may be configured to store user data and/or metadata of the journal region. The controller 130 may be configured to secure nonvolatility with respect to only the selected region 125 of the second region 124. When a size of data that the external host device writes in the second region 124 is greater than a capacity of the selected region 125, nonvolatility may not be secured with respect to some portions of the data. To prevent or reduce this issue, the storage device 100 according to some example embodiments of some inventive concepts may support a flush request. When a flush request is received from the external host device, the controller 130 may be configured to perform an operation for securing nonvolatility of data that are provided from the external host device and are written in the second region 124.

Figure 9:
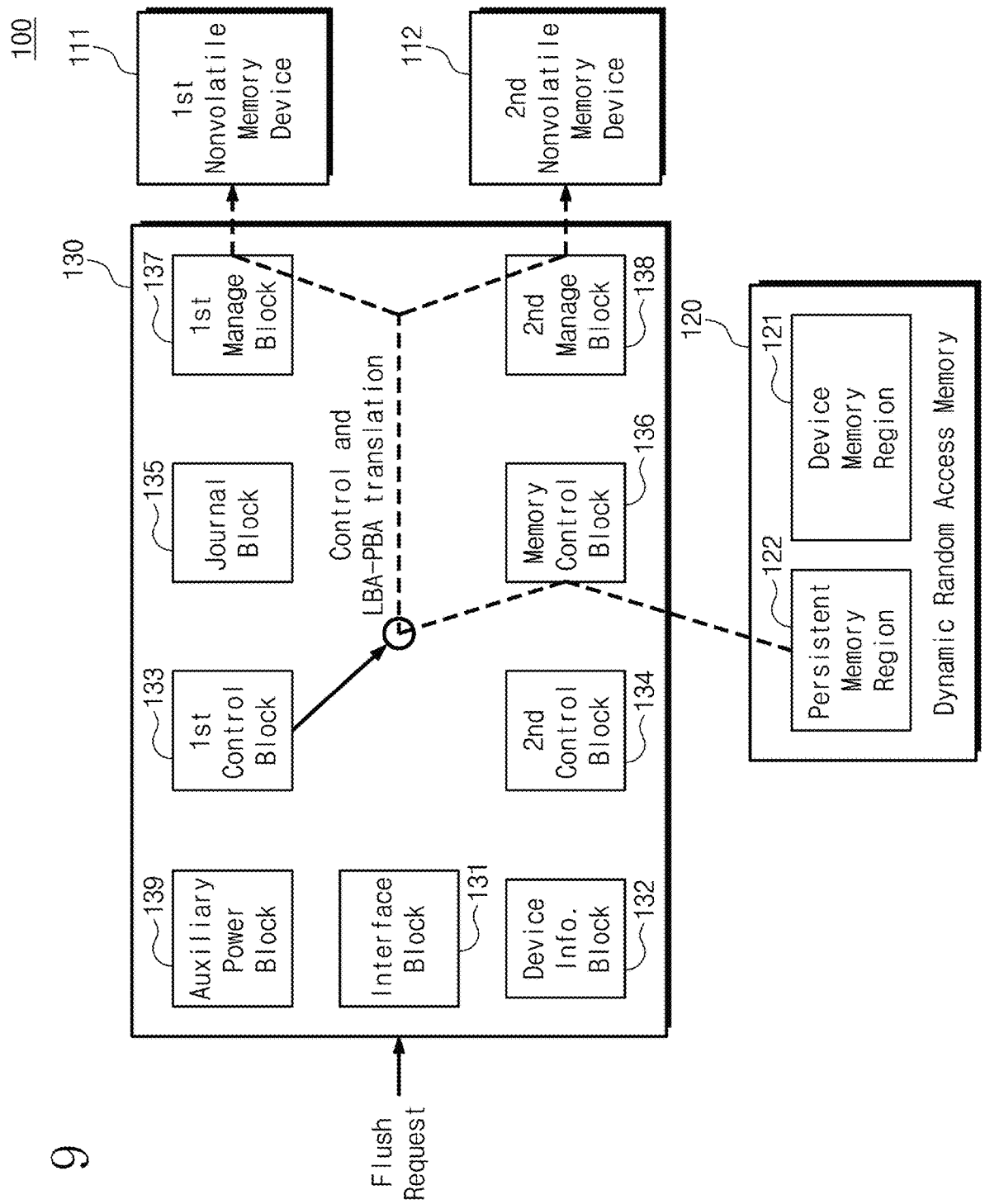
FIG. 9 illustrates an example embodiment including a storage device configured to process a flush request.
Figure 10:
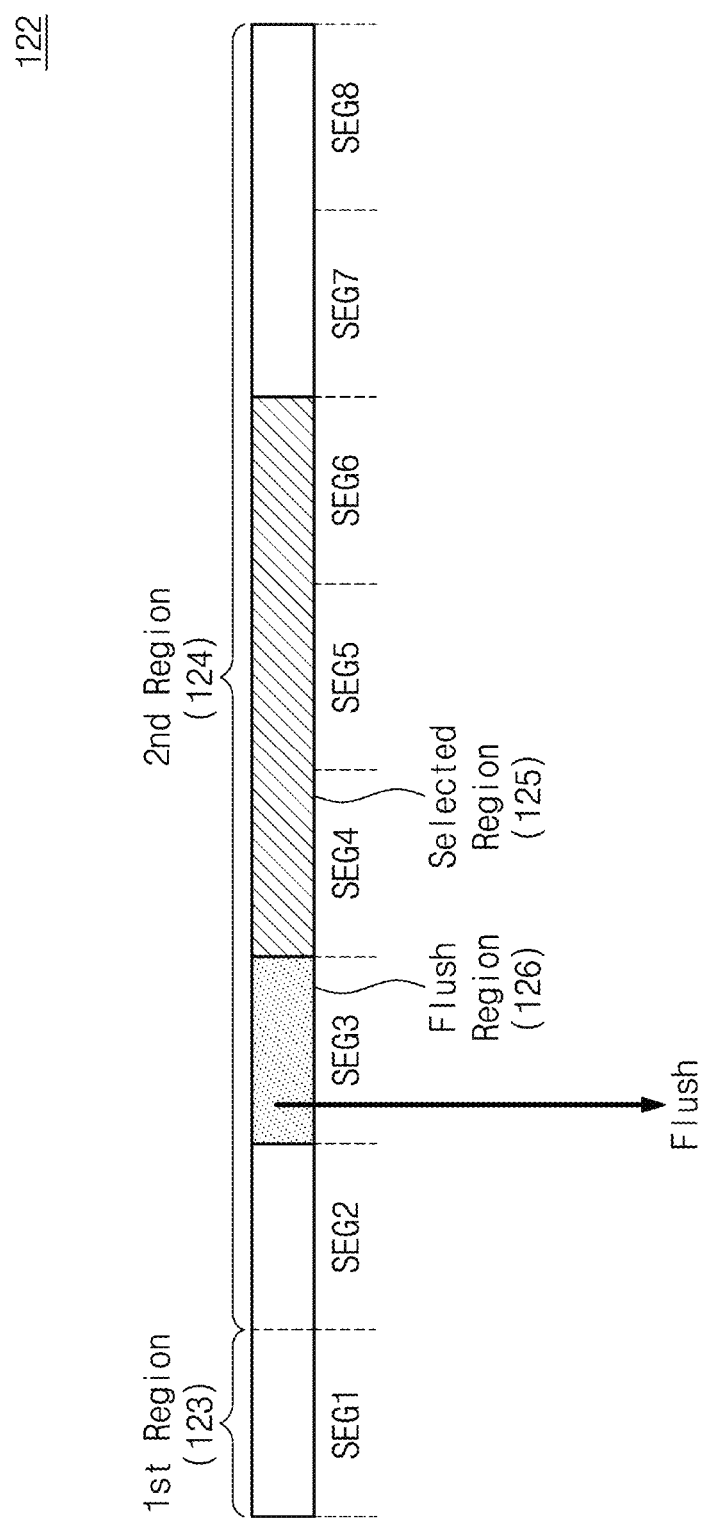
FIG. 10 illustrates an example embodiment including a persistent memory region that is managed based on a flush request.

FIG. 9 illustrates an example embodiment including a storage device 100 that processes a flush request. FIG. 10 illustrates an example embodiment including a persistent memory region 122 that is managed based on a flush request. Referring to FIGS. 9 and 10, a flush request may be received from an external host device. Based on the flush request, the first control block 133 may be configured to read data from the persistent memory region 122. For example, a head pointer may indicate the third segment SEG3 corresponding to the head of the selected region 125, and a tail pointer may indicate the fifth segment SEG5 corresponding to the tail of the selected region 125, or vice versa. The first control block 133 may be configured to read data from a segment indicated by the head pointer and/or the tail pointer, that is, from the third segment SEG3 to the fifth segment SEG5, and/or one or more segments between the head pointer and the tail pointer. User data that are written in a journal region may include data and a logical block address LBA. The first control block 133 may be configured to translate the logical block address LBA to a physical block address PBA. The first control block 133 may be configured to write the user data in the first nonvolatile memory device 111 or the second nonvolatile memory device 112 based on the physical block address PBA. That is, in response to a flush request, the third segment SEG3 indicated by the head pointer of the selected region 125 may be selected as a flush region 126, and data of the flush region 126 may be flushed to the first nonvolatile memory device 111 or the second nonvolatile memory device 112. Accordingly, the nonvolatility for the data of the third segment SEG3 may be secured.

As further shown in the example embodiment of FIG. 9, after the flush operation is performed, the controller 130 may be configured to remove the third segment SEG3 of the flush region 126 from the selected region 125. Accordingly, the head pointer may be updated to indicate the fourth segment SEG4. The controller 130 may be configured to include the sixth segment SEG6 following the tail pointer of the selected region 125 in the selected region 125. Accordingly, the tail pointer may be updated to include the sixth segment SEG6. The controller 130 may be configured to assign the selected region 125 in a ring buffer manner within the second region 124. For example, the controller 130 may be configured to write the data that is stored in a segment (or a segment indicated by the head pointer) having the lowest address from among at least two segments of the selected region 125, in the nonvolatile memory device 111 or 112, and/or to deselect the segment having the lowest address. The controller 130 may be further configured to select a segment (e.g., a segment indicated by the tail pointer), which corresponds to a region of continuous addresses, that is, an address that is continuous to the highest address of addresses of at least two segments of the selected region 125 and/or is higher than the highest address, as the selected region 125. That is, when a capacity of the selected region 125 is insufficient, the controller 130 may be configured to flush data corresponding to the head of the selected region 125 and/or to move the selected region 125. Accordingly, nonvolatility of data written by the external host device may be secured. For example, a write operation of the first nonvolatile memory device 111 and/or the second nonvolatile memory device 112 according to a flush request may have a high priority. A write operation of the flush request may be first performed prior to any other write and/or read operation. Based on the write operation of the flush request being first performed, the controller 130 may be configured to reduce latency that may occur due to the external host device performing a write operation on a journal region.

Figure 11:
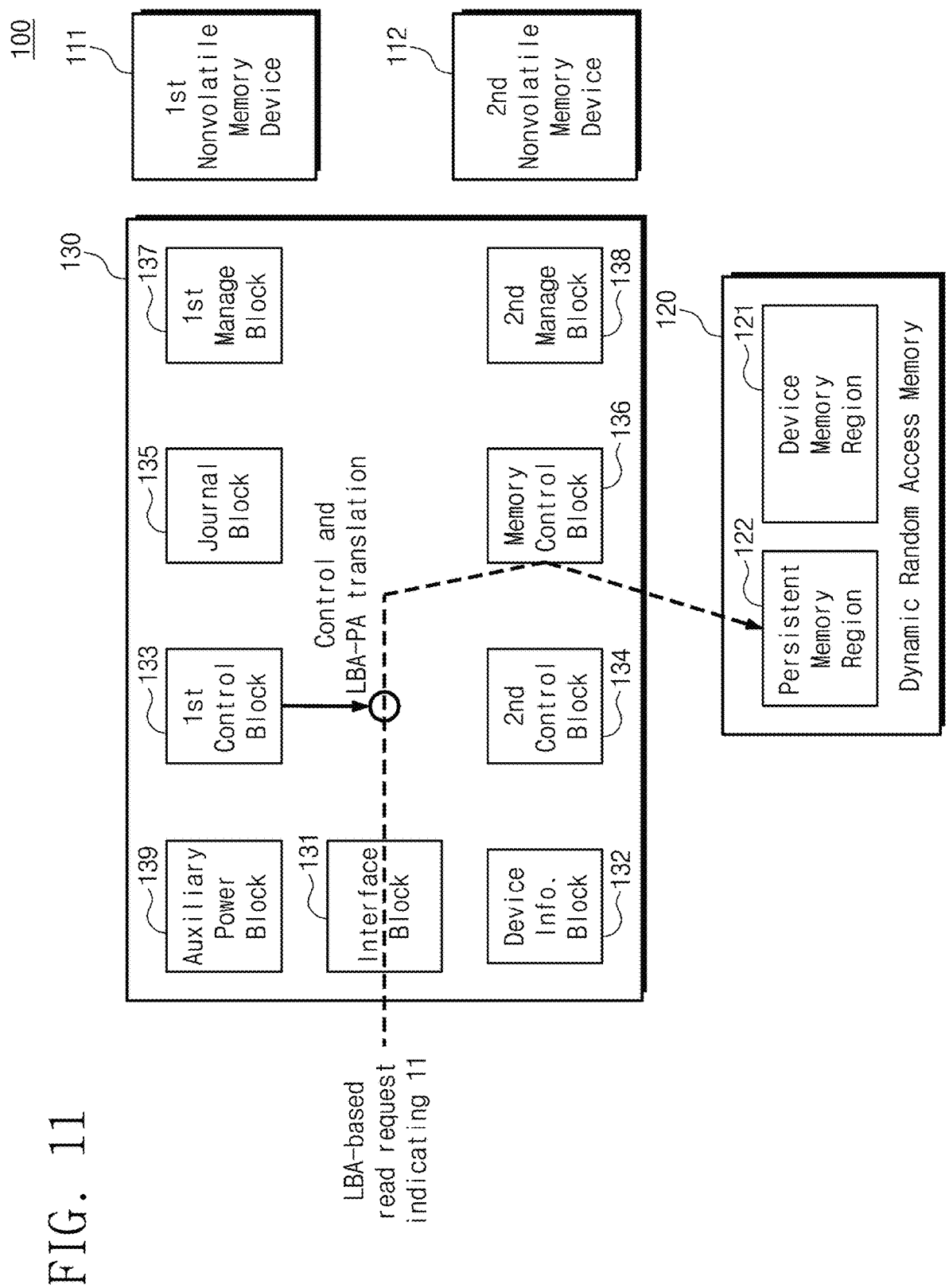
FIG. 11 illustrates an example embodiment including a controller configured to process a read request based on a logical block address.

FIG. 11 illustrates an example embodiment including a controller 130 that processes a read request based on a logical block address LBA. Referring to FIGS. 3 and 11, a logical block address LBA may indicate the capacity 11 of the first persistent memory region PMR to which the logical block address LBA is assigned. The first control block 133 may be configured to translate the logical block address LBA to a physical address PA based on the second mapping table. The first control block 133 may be configured to read data from the persistent memory region 122 based on the physical address PA.

Figure 12:
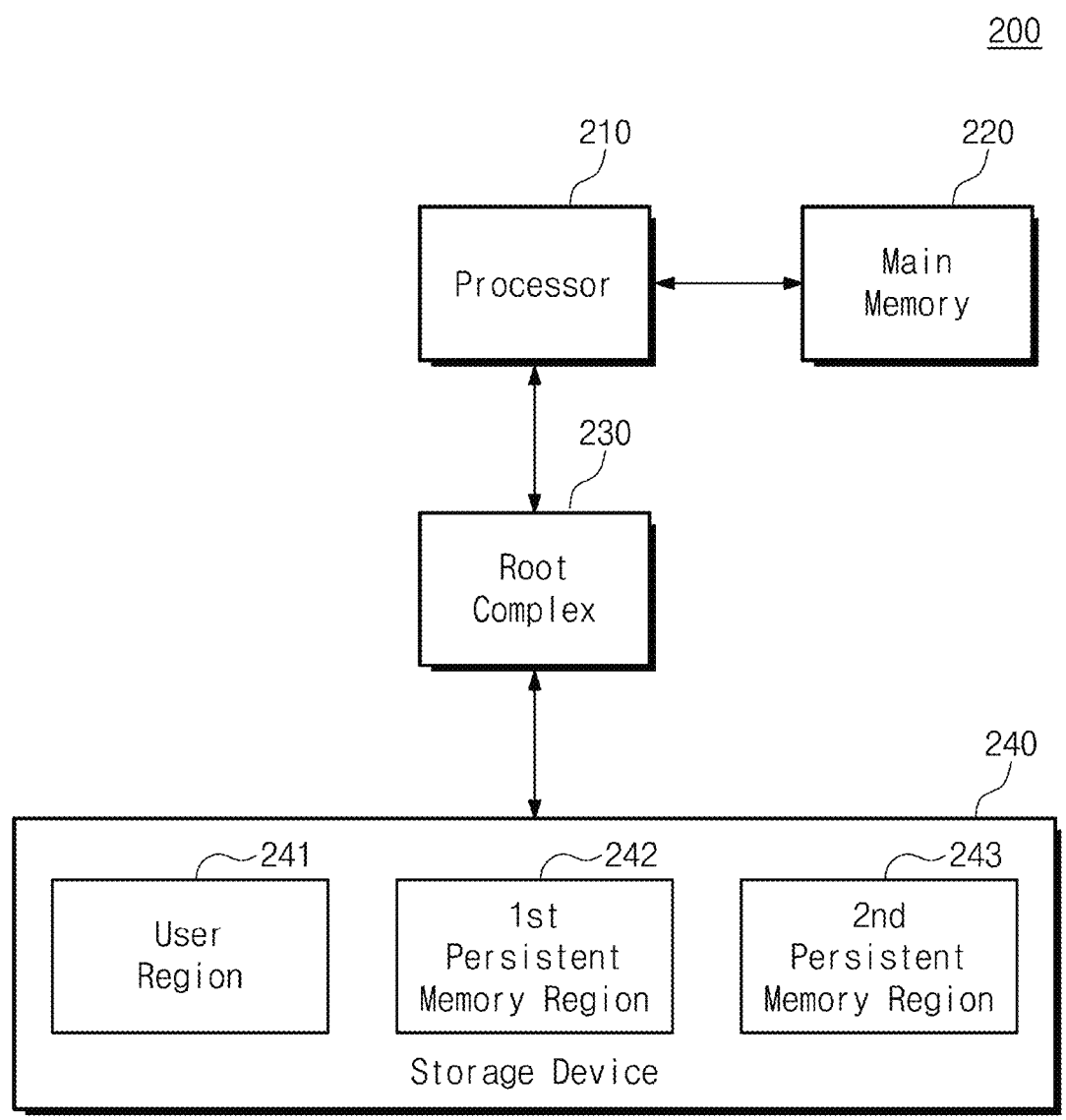
FIG. 12 illustrates an example embodiment including a computing system.

FIG. 12 illustrates an example embodiment including a computing system 200. Referring to FIGS. 3 and 12, the computing system 200 may include a processor 210, a main memory 220, a root complex 230, and/or a storage device 240. The processor 210 may drive an operating system and/or applications. The processor 210 may include a central processing unit (CPU) and/or an application processor. The main memory 220 may be a system memory used by the processor 210. The main memory 220 may include a dynamic random access memory. The processor 210 may be configured to load and/or use user data and/or metadata (e.g., a file system) stored in the storage device 240 onto the main memory 220. The root complex 230 may be configured to provide devices that allow the processor 210 to control peripheral devices. The storage device 240 may be connected to the root complex 230. The storage device 240 may include the storage device 100 described with reference to FIGS. 1 to 11. When viewed from the processor 210, the storage device 240 may include a user region 241 to which a logical block address LBA is assigned, a persistent memory region 242 (hereinafter referred to as a "first persistent memory region") to which the logical block address LBA is assigned, and/or a memory mapped persistent memory region 243 (hereinafter referred to as a "second persistent memory region").

Figure 13:
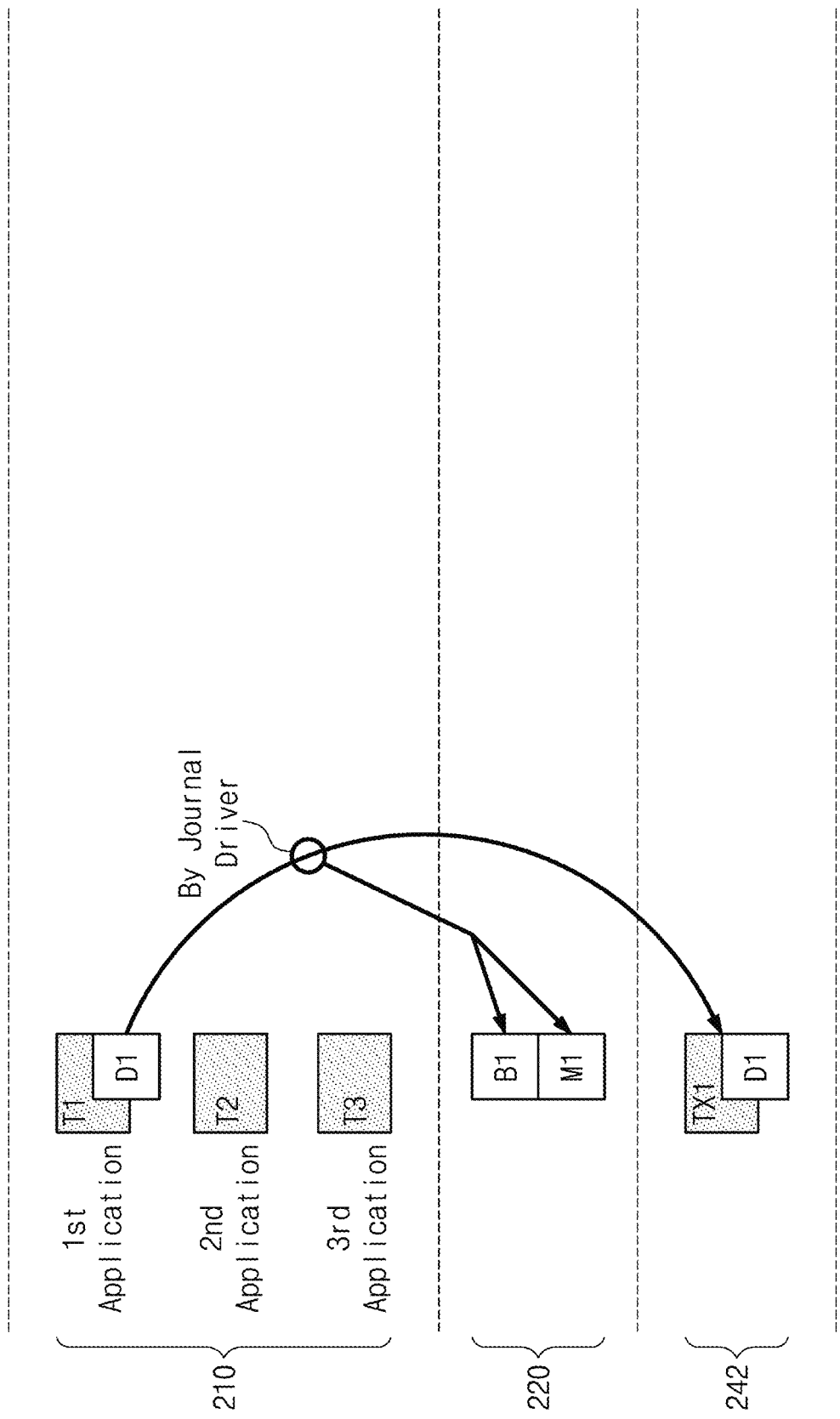
FIG. 13 illustrates an example embodiment including a first application updating first user data.

FIG. 13 illustrates an example embodiment including in which a first application driven on the processor 210 updates first user data D1. Referring to FIGS. 12 and 13, a first application, a second application, and/or a third application driven on the processor 210 may be configured to execute a first thread T1, a second thread T2, and a third thread T3, respectively. The first thread T1 of the first application may be configured to modify the first user data D1 stored in the storage device 240. In this case, as described with reference to FIG. 5, the first application may be configured to directly write the modified first user data D1 in the first persistent memory region 242 of the storage device 240, that is, a journal region, instead of the main memory 220. For example, the first application may be configured to directly write the first user data D1, and/or to call a journal driver driven on a kernel, which may be called and configured to write the first use data D1. The first persistent memory region 242 may be a memory mapped region. Accordingly, the first application or the journal driver driven on the processor 210 may be configured to directly write the first user data D1 in the first persistent memory region 242 in the unit of a byte. For example, the first user data D1 may be written in the first persistent memory region 242 being the journal region as a portion of a first transaction TX1. Based on the first user data D1 being modified, a file system associated with the first user data D1 may be modified. The journal driver may be configured to store the modification data of the file system in the main memory 220 as first metadata M1. The journal driver may be configured to store, in a journal region of the main memory 220, a first bitmap B1 including information about modification of the file system and/or to manage the first bitmap B1. Based on the first metadata M1 indicating modification of the file system being stored in the main memory 220, the journal driver may be configured to record information indicating a position of the first metadata M1 at the first bitmap B1.

Figure 14:
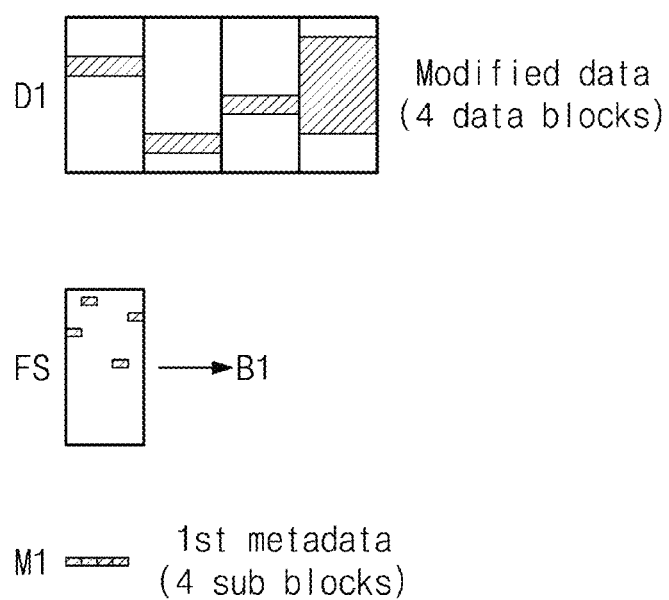
FIG. 14 illustrates examples of first user data, first metadata, and first bitmap.

FIG. 14 illustrates an example embodiment including first user data D1, first metadata M1, and a first bitmap B1. Referring to FIGS. 12 and 14, a unit of data that the computing system 200 is configured to manage may be a block (e.g., a logical block). The computing system 200 may be configured to perform a write operation and/or a read operation on the user region 241 of the storage device 240 in the unit of a block. For example, the first user data D1 may correspond to four blocks. When the first application of the processor 210 requests to access the first user data D1, the four blocks of the first user data D1 may be loaded onto the main memory 220 from the user region 241 of the storage device 240. The first application of the processor 210 may be configured to access the first user data D1 loaded onto the main memory 220 in the unit of a byte. For example, the first application of the processor 210 may be configured to modify the first user data D1 in the unit of a byte. Portions of the first user data D1 shown with a slashed appearance ("slashed portions") may correspond to portions modified by the first application of the processor 210. Based on the first application of the processor 210 modifying the first user data D1, the first user data D1 may be written in the first persistent memory region 242 being the journal region. Based on the first user data D1 being modified, a file system FS associated with the first user data D1 may also be modified. For example, the file system FS may be managed in the unit of a block. Data of the file system FS may be managed in the unit of a block, but a small portion may correspond to the first user data D1. In the block of the file system FS, slashed portions may correspond to modified portions. In the block of the file system FS, modified portions may correspond to four sub-blocks.

In some example embodiments, a journal driver of the processor 210 may be configured to permit only four modified sub-blocks of the block of the file system FS wait for a commit as the first metadata M1, instead of letting the whole block of the file system FS wait for a commit. Information indicating positions of the first metadata M1 in the block of the file system FS may be recorded at the first bitmap B1. For example, the first bitmap B1 may include bits as much as the number of modification units (e.g., byte or bytes) belonging to the block of the file system FS. Each bit, corresponding to a position within the block, may be set to a value indicating whether a modification unit of the block has been modified. In some example embodiments, a modification unit is identified as modified based on a write request including the modification unit that has not yet been committed to nonvolatile storage, and is identified as unmodified based on an absence of a write request including the modification unit that has not yet been committed to nonvolatile storage. In some example embodiments, a modification unit is identified as modified based on a write request including data for the modification unit that is different than data that has been committed to the nonvolatile storage for the modification unit, and is identified as unmodified based on an absence of a write request including data for the modification unit that is different than data that has been committed to the nonvolatile storage for the modification unit (such that write requests including data for the modification unit that is the same as data that has been committed to the nonvolatile storage for the modification unit may be disregarded). Values of the bits in the first bitmap B1 may indicate modified portions of the block of the file system FS.

In some example embodiments, the controller (e.g., the journal driver) may be configured to expose the second region to the external host device for user data that is accessible as a block unit, and to store, in the first region, a journal indicating modification of data of the second region, wherein the journal indicates sub-blocks of the block unit that are to be committed to the nonvolatile memory device, and flush the second region to the nonvolatile memory storage by committing the sub-blocks of the block unit indicated by the journal. For example, instead of letting the whole block of the file system FS wait for a commit, only, the journal driver may be configured to let the first metadata M1 corresponding to the modified portions of the block of the file system FS and the first bitmap B1 indicating a position of the first metadata M1 within the block wait for a commit. Accordingly, the amount of data to be written in the first persistent memory region 242 being the journal region upon performing the commit may decrease and/or a time to perform the commit may decrease. Also, when the first user data D1 are modified, the first user data D1 may be written (e.g., immediately or promptly) in the first persistent memory region 242 being the journal region without waiting for the commit. Accordingly, because it may not be necessary to write the first user data D1 upon performing the commit, the amount of data targeted for the commit may decrease and/or a time to perform the commit may decrease.

Figure 15:
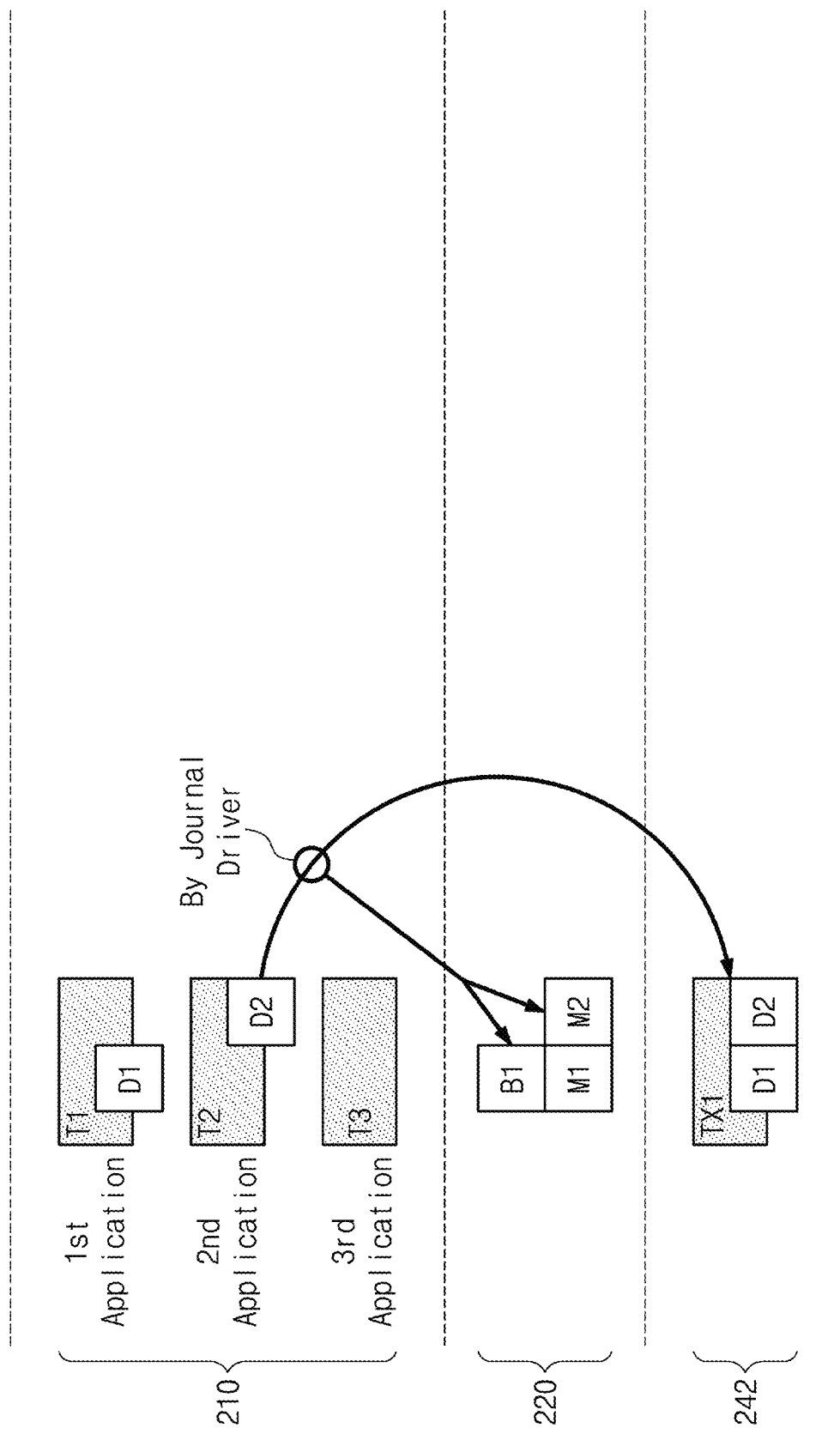
FIG. 15 illustrates an example embodiment including a second application modifying second user data, following FIG. 13.

FIG. 15 illustrates an example embodiment including a second application that modifies second user data D2, such as shown in FIG. 13. Referring to FIGS. 12, 13, and 15, the second application may be configured to modify the second user data D2. As described with reference to FIG. 5, the second application may be configured to write (e.g., immediately or promptly) the modified second user data D2 in the first persistent memory region 242 being the journal region as a portion of the first transaction TX1. Based on the second user data D2 being modified, as described with reference to FIG. 14, the journal driver of the processor 210 may be configured to store modification data of the file system corresponding to the second user data D2 in the main memory 220 as second metadata M2. Also, the journal driver of the processor 210 may be configured to record positions of the second metadata M2 at the first bitmap B1.

Figure 16:
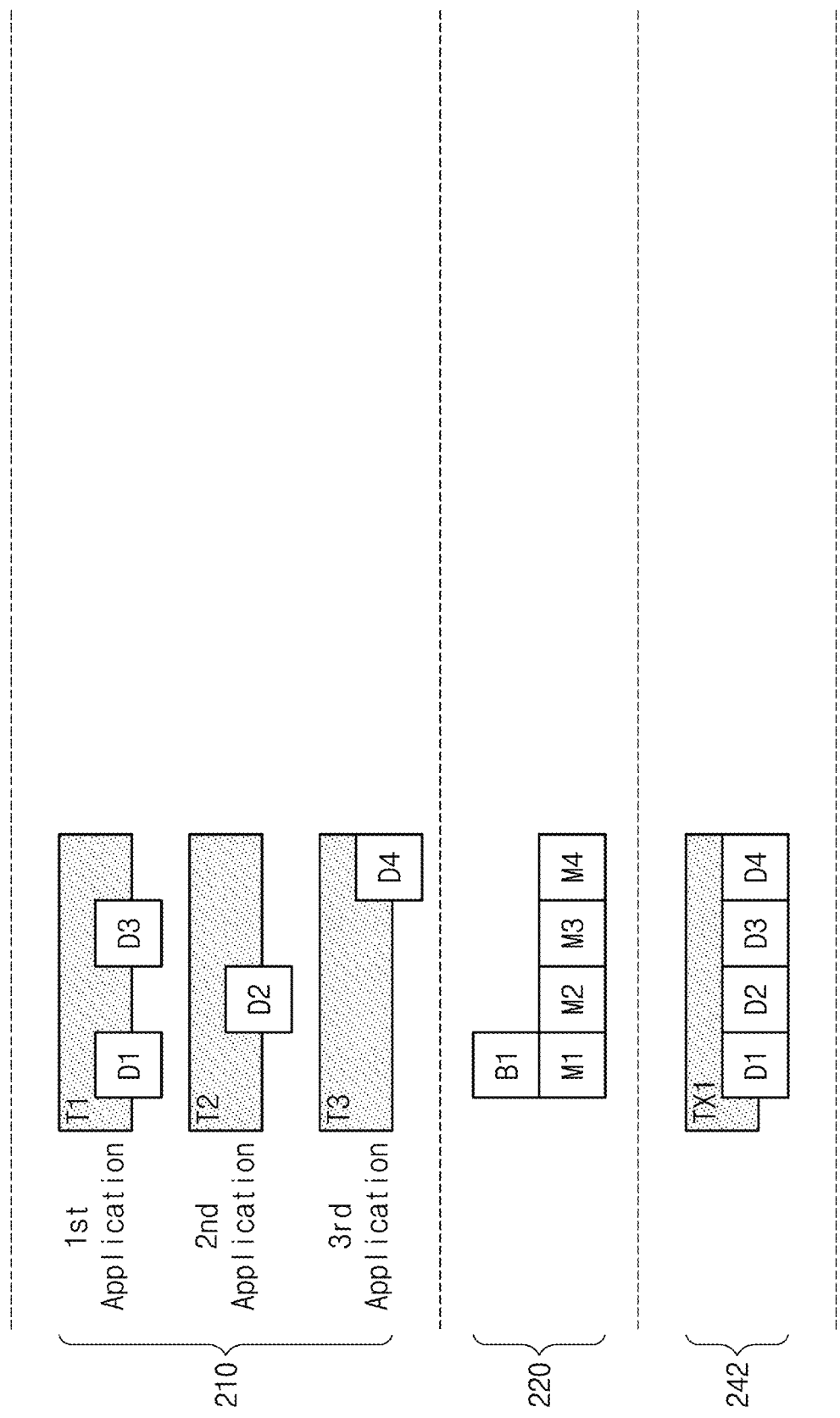
FIG. 16 illustrates an example embodiment including a first application and a third application modifying third user data and fourth user data, respectively, following FIG. 15.

FIG. 16 illustrates an example embodiment including a first application and a third application that modify third user data D3 and fourth user data D4, respectively, following FIG. 15. Referring to FIGS. 12, 15, and 16, the first application may be configured to modify the third user data D3. As described with reference to FIG. 5, the first application may be configured to write (e.g., immediately or promptly) the modified third user data D3 in the first persistent memory region 242 being the journal region as a portion of the first transaction TX1. Based on the third user data D3 being modified, as described with reference to FIG. 14, the journal driver of the processor 210 may be configured to store modification data of the file system corresponding to the third user data D3 in the main memory 220 as third metadata M3. Also, the journal driver of the processor 210 may be configured to record positions of the third metadata M3 at the first bitmap B1. The third application may be configured to modify the fourth user data D4. As described with reference to FIG. 5, the third application may be configured to write (e.g., immediately or promptly) the modified fourth user data D4 in the first persistent memory region 242 being the journal region as a portion of the first transaction TX1. Based on the fourth user data D4 being modified, as described with reference to FIG. 14, the journal driver of the processor 210 may be configured to store modification data of the file system corresponding to the fourth user data D4 in the main memory 220 as fourth metadata M4. Also, the journal driver of the processor 210 may be configured to record positions of the fourth metadata M4 at the first bitmap B1.

Figure 17:
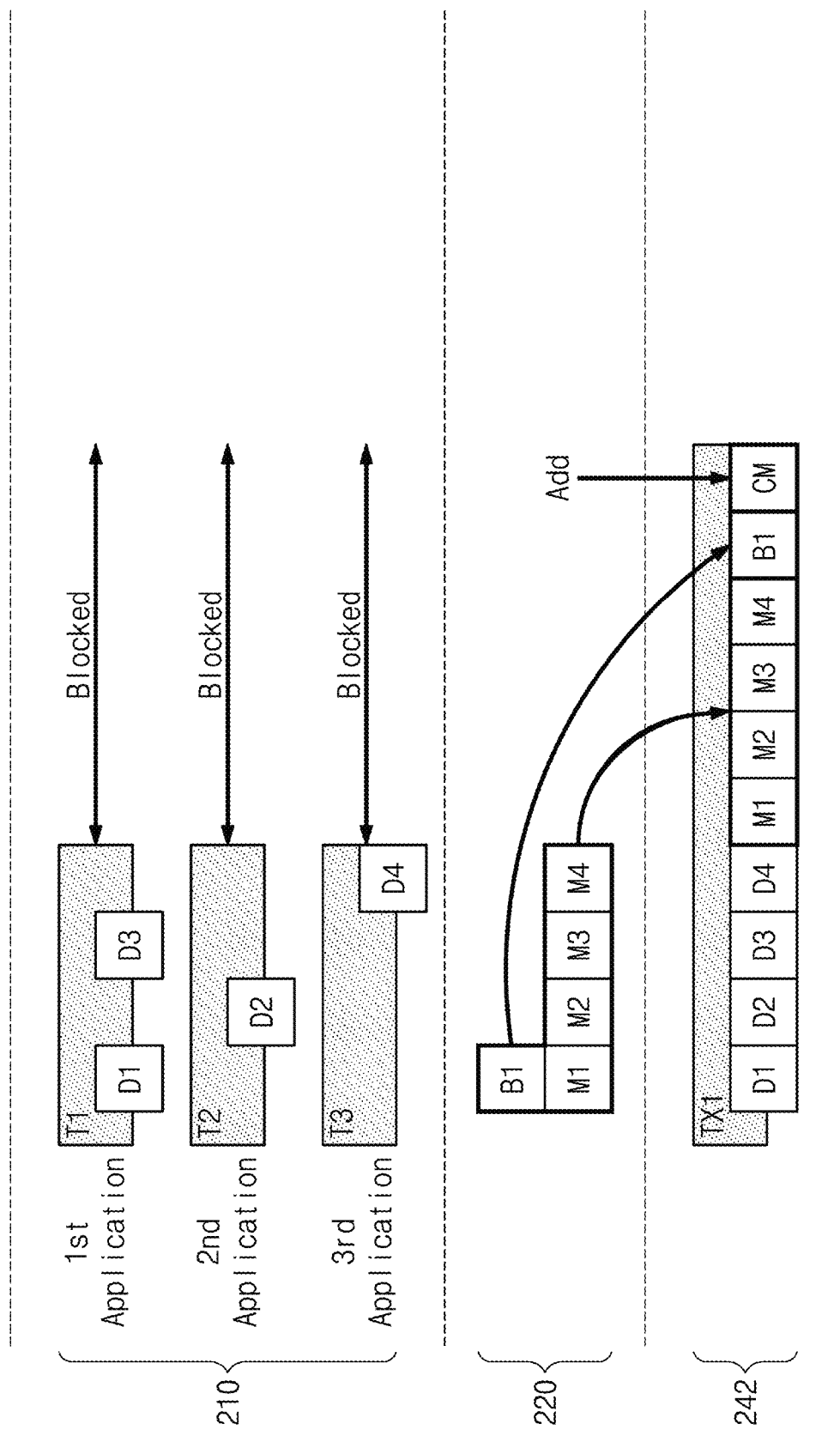
FIG. 17 illustrates an example embodiment including a commit that is performed in a computing system, following FIG. 16.

FIG. 17 illustrates an example embodiment including a commit being performed in the computing system 200, following FIG. 16. Referring to FIGS. 12, 16, and 17, based on the amount of data of the first transaction TX1 reaching a threshold designated by the journal driver, and/or based on any one of the first to third applications requesting synchronization, a commit may be performed. While the commit is performed, the modification of user data of the first to third applications may be blocked. As described with reference to FIG. 5, the journal driver of the processor 210 may be configured to write the first to fourth metadata M1 to M4 stored in the main memory 220 in the first persistent memory region 242 being the journal region as a portion of the first transaction TX1. Also, the journal driver of the processor 210 may write the first bitmap B1 stored in the main memory 220 as a second bitmap B2 in the first persistent memory region 242 being the journal region as a portion of the first transaction TX1. The journal driver of the processor 210 may be configured to write a commit mark CM, which may indicate that the commit is completed, in the first persistent memory region 242 being the journal region as a portion of the first transaction TX1. Based on the commit mark CM being added, the first transaction TX1 may be completed. In an embodiment, as the commit is completed, the first bitmap B1 may be initialized. As such, the commit may be completed through only an operation of writing the first to fourth metadata M1 to M4 and adding the commit mark CM, rather than committing the entire block. Accordingly, the amount of data to be written during the commit may decrease, and/or a time to perform the commit may decrease and/or a speed at which the storage device 240 and/or the computing system 200 operate may be increased.

Figure 18:
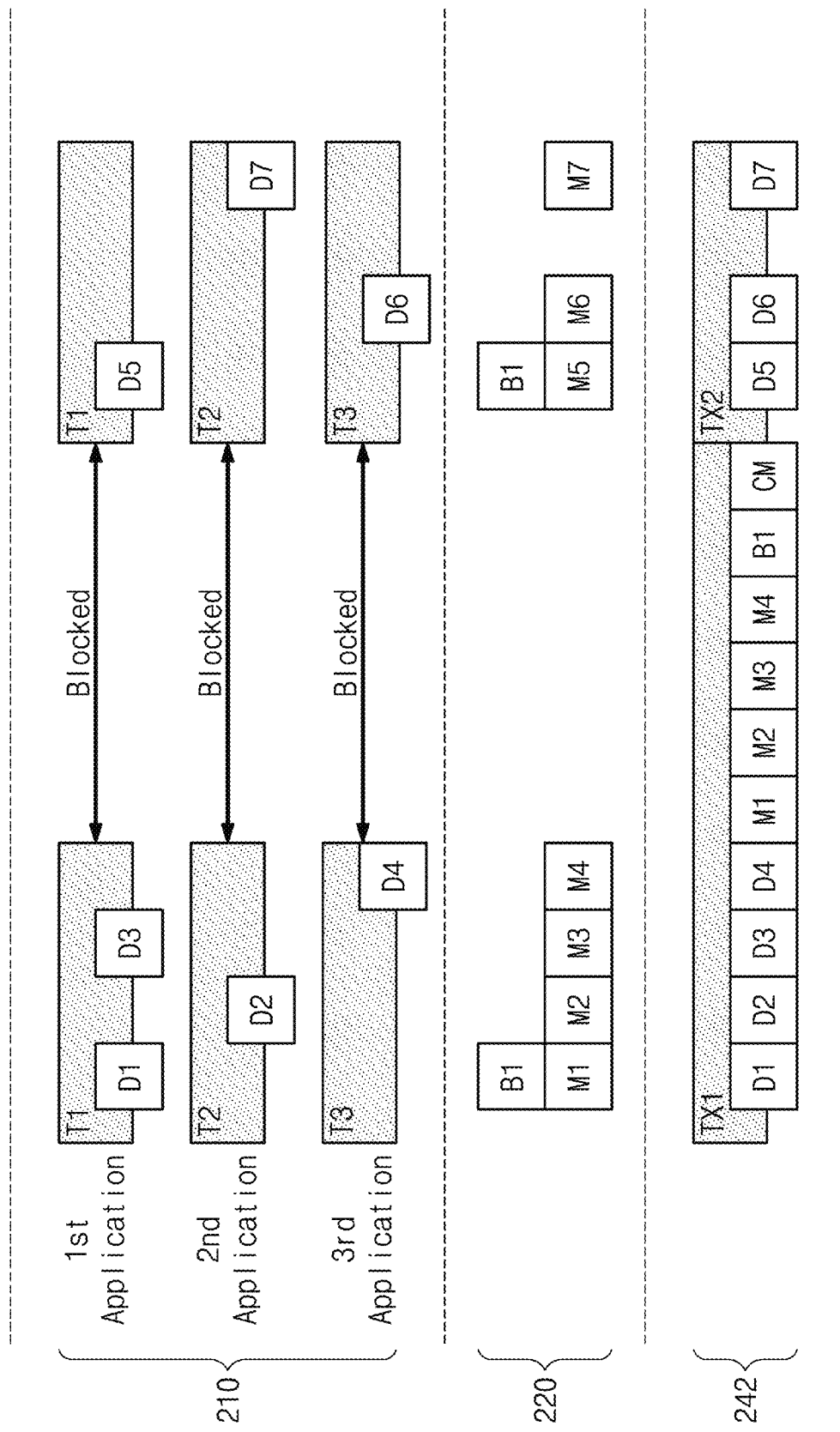
FIG. 18 illustrates an example embodiment including first to third applications that modify fifth to seventh user data, following FIG. 17.

FIG. 18 illustrates an example embodiment including first to third applications modifying fifth to seventh user data D5 to D7, following FIG. 17. Referring to FIGS. 12, 17, and 18, as described with reference to FIG. 5, the fifth to seventh user data D5 to D7 may be written in the first persistent memory region 242 being the journal region as a portion of a second transaction TX2. Fifth to seventh metadata M5 to M7 respectively corresponding to the fifth to seventh user data D5 to D7 may be stored in the main memory 220. Positions of the fifth to seventh metadata M5 to M7 may be recorded at the first bitmap B1. As described above, the storage device 100 or 240 according to some example embodiments of some inventive concepts may be configured to expose a portion of a storage capacity of the dynamic random access memory 120 to the processor 210 as a byte addressable memory mapped region (e.g., the persistent memory region 122 or 242). Accordingly, as described with reference to FIG. 5, an application or an operating system of the processor 210 may be configured to directly write modified user data to the persistent memory region 122 or 142. By directly writing modified user data and by allowing only modification data of the file system to wait as metadata for a commit, the amount of data targeted for the commit of the computing system 200 may decrease, and/or a time to perform the commit may decrease. As described with reference to FIG. 11, after data of the persistent memory region 122 or 243 is recovered after the sudden power-off SPO event, the journal driver of the processor 210 may be configured to read a committed transaction (e.g., TX1) to recover a file system. Alternatively or additionally, when applying the committed transaction TX1 to the user region 241, the journal driver of the processor 210 may be configured to read the committed transaction TX1 from the persistent memory region 122 or 243. A read operation that is performed in the persistent memory region 122 or 243 may be performed based on a logical block address LBA. Comparing the MMIO mode and the block-based I/O of the PCIe or NVMe, as the amount of data increases, a speed at which a read operation is performed in the unit of a block may become higher than a speed at which a read operation of the MMIO is performed. A speed at which the committed transaction TX1 is read may be further increased by permitting an MMIO-based write operation and/or a block-based read operation with respect to the persistent memory region 122.

In some example embodiments presented herein, some components of the storage device 100 are described by using the terms "first," "second," "third," and the like. However, the terms "first," "second," "third," and the like may be used to distinguish components from each other and do not limit some inventive concepts. For example, except where expressly stated, the terms "first," "second," "third," and the like may not be intended to indicate an order or a numerical meaning of any form. Rather, terms such as "first, second," "third," and the like are only used as labels to distinguish one element from another element, and not necessarily to imply an order, ranking, etc. between and among the labeled elements. As an example, an arrangement including a "first" element and a "second" element may alternatively have been described as a "second" element and a "first" element, respectively. All such interpretations that are reasonably and logically possible, and that are not contradictory with other statements, are intended to be included in this disclosure, the scope of which is to be understood as being limited only by the claims.

As shown in the accompanying drawings, some components according to some example embodiments of some inventive concepts are described by using blocks. The blocks may be implemented with various hardware devices, such as an integrated circuit (IC), an application-specific integrated circuit (ASIC), a field programmable gate array (FPGA), and a complex programmable logic device (CPLD), firmware driven in hardware devices, software such as an application, or a combination of a hardware device and software. Also, the blocks may include circuits or intellectual property (IP) implemented with semiconductor elements in an integrated circuit. Additionally, some example embodiments presented herein may exhibit an example organization of such components. Other example embodiments may include a different organization of components, such as renaming, rearranging, adding, partitioning, duplicating, merging, and/or removing components, sets of components, and relationships thereamong, without departing from the scope of the present disclosure. All such variations that are reasonably technically and logically possible, and that are not contradictory with other statements, are intended to be included in this disclosure, the scope of which is to be understood as being limited only by the claims.

According to some example embodiments of some inventive concepts, a storage device may provide a storage region that permits a block-based access and a memory mapped access. The storage region may be configured to support a commit of an operating system. Accordingly, a storage device and an operating method of the storage device may be capable of reducing a latency and/or a time to perform a commit.

While some inventive concepts have been described with reference to some example embodiments thereof, it may be apparent to those of ordinary skill in the art that various changes and modifications may be made thereto without departing from the spirit and scope of some inventive concepts as set forth in the following claims.

What is claimed is:

1. A storage device comprising:
a nonvolatile memory device;
a dynamic random access memory including a first region and a second region including a set of segments; and
a controller configured to,
use the first region as a device memory;
use the second region of the dynamic random access memory to store data for a modification during a first time;
use the second region as a journal memory to store a journal indicating the modification during second time,
expose a user region of the nonvolatile memory device to an external host device as a first access region of a block unit,
select a first segment of the segments, to select at least two second segments from the remaining segments of the segments other than the first segment, and
provide non volatility to the selected segments,
wherein the at least two second segments are dynamically changed in a ring buffer manner within the remaining segments, and
wherein the modification is for data of the user region.

2. The storage device of claim 1, wherein the controller is further configured to, back up data stored in the selected segments to the nonvolatile memory device based on an interruption of power from the external host device, and load the data onto the selected segments based on a restoration of power from the external host device.

3. The storage device of claim 1, wherein the controller is further configured to, provide the first segment as a storage space of a super-block of a journal region of the external host device, and provide the at least two second segments as a storage space of at least one transaction of the journal region of the external host device.

4. The storage device of claim 1, wherein the controller is further configured to expose the second region to the external host device as both a second access region of the block unit and a third access region of a byte unit.

5. An operating method of a storage device including a controller, a nonvolatile memory device, and a dynamic random access memory, the method comprising:

providing, by the controller, a portion of a storage space of the nonvolatile memory device to an external host device as a user region; and providing, by the controller, a portion of a storage space of the dynamic random access memory to the external host device as a journal region, a write operation of a byte unit and a read operation of a block unit being permitted, the journal region including segments, and providing, by the controller, nonvolatility to a first segment and at least two second segments from among the segments, the first segment being fixed and the at least two second segments being dynamically changed.

* * * * *

UNITED STATES PATENT AND TRADEMARK OFFICE
CERTIFICATE OF CORRECTION

PATENT NO. : 11,301,331 B2
APPLICATION NO. : 16/529320
DATED : April 12, 2022
INVENTOR(S) : Seokhwan Kim et al.

It is certified that error appears in the above-identified patent and that said Letters Patent is hereby corrected as shown below:

On the Title Page

Item (72):
Chui Lee, Hwaseong-si (KR) should read -- Chul Lee, Hwaseong-si (KR) --

Signed and Sealed this
Fifth Day of July, 2022

Katherine Kelly Vidal
*Director of the United States Patent and Trademark Office*